US005578955A

United States Patent [19]
Matsue et al.

[11] Patent Number: 5,578,955
[45] Date of Patent: Nov. 26, 1996

[54] SIGNAL SUPPLY CIRCUIT

[75] Inventors: Shuichi Matsue; Hiroshi Furukawa, both of Itami, Japan

[73] Assignee: Mitsubishi Denki Kabushiki Kaisha, Tokyo, Japan

[21] Appl. No.: 233,271

[22] Filed: Apr. 26, 1994

[30] Foreign Application Priority Data

May 7, 1993 [JP] Japan .................................. 5-106762
Dec. 9, 1993 [JP] Japan .................................. 5-309250

[51] Int. Cl.$^6$ .............................................. H03K 19/096
[52] U.S. Cl. .............................................. 327/292; 327/296
[58] Field of Search .............................................. 327/292, 295, 327/296, 564, 565, 141, 144; 326/93, 101

[56] References Cited

U.S. PATENT DOCUMENTS

| | | | |
|---|---|---|---|
| 4,812,684 | 3/1989 | Yamagiwa et al. | 327/565 |
| 5,124,578 | 6/1992 | Worley et al. | 327/292 |
| 5,172,330 | 12/1992 | Watanabe et al. | 327/565 |
| 5,264,746 | 11/1993 | Ohmae et al. | 327/292 |
| 5,307,381 | 4/1994 | Ahuja | 327/292 |
| 5,396,129 | 3/1995 | Tabira | 327/292 |

FOREIGN PATENT DOCUMENTS 403058624 3/1991 Japan .................................. 326/93

OTHER PUBLICATIONS

Proceedings of the IEEE 1990 Custom Integrated Circuits Conference, May 13–16, 1990, Takashi Saigo, et al., "Clock Skew Reduction Approach for Standard Cell", 16.4.1–16.4.3.

Proceedings of the IEEE 1993 Custom Integrated Circuits Conference, May 9–12, 1993, Nobuyuki Ikeda, et al., "0.5μm 1M Gate CMOS SOG", pp. 23.2.1–23.2.4.

Primary Examiner—Timothy P. Callahan
Assistant Examiner—T. Lam
Attorney, Agent, or Firm—Oblon, Spivak, McClelland, Maier & Neustadt, P.C.

[57] ABSTRACT

A signal is supplied to a number of synchronizing circuits with a small skew. A signal supply circuit (400a) includes four driver circuits (1a), (401), (402) and (403). The driver circuit (1a) receives an input signal which is supplied to synchronizing circuits (301) to (332). An output of the driver circuit (1a) is supplied to the left-hand side edge of a first wire (5). The driver circuits (401), (403) and (402) are disposed at the left-hand side edge, the right-hand side edge and a center of first wire (5), respectively, so that outputs from the driver circuits (401), (403) and (402) are supplied to a second wire (6). Input terminals of the synchronizing circuits (301) to (332) are each connected to the second wire (6). The driver circuits (401), (402) and (403), i.e., second signal transmitting elements, start transmission in this order, and therefore, a transition of the signal becomes abrupt at the driver circuits (401), (402) and (403) in this order.

21 Claims, 21 Drawing Sheets

SIGNAL SUPPLY CIRCUIT

BACKGROUND OF THE INVENTION

1. Field of the Invention

The present invention relates to a signal supply circuit for supplying a signal to a plurality of synchronizing circuits.

2. Description of the Background Art

A. Background Art

There are two major types of systems for supplying a signal to synchronizing circuits; that is, the trunk type system and the tree type system. In the following, conventional techniques using these two systems will be described with respect to both structure and associated problems.

(A-1) Conventional Technique using Trunk Type System:

FIG. 20 is a circuitry diagram showing a conventional trunk type signal supply method. This method is described in "IEEE 1990 CUSTOM INTEGRATED CIRCUITS CONFERENCE PROCEEDING," 16.4.1 (FIG. 1). A signal input driver circuit i includes an input terminal and an output terminal which is connected to a trunk wire 2. A synchronizing circuit group 300a is connected to the trunk wire 2 with a certain distance. The synchronizing circuit group 300a consists of thirty-two synchronizing circuits 301 to 332 to which a signal is to be supplied. Although in reality reference numerals are to be assigned to the synchronizing circuits as 301 to 332 from the left hand-side to the right hand-side, for clarity of illustration, not all of the reference numerals are shown in FIG. 1. The synchronizing circuits 301 to 332 each have an input terminal and an output terminal. The input terminals of the synchronizing circuits 301 to 332 are each connected to the circuits 301 to 332 are each connected to the trunk wire 2.

In the circuit which has such a structure as above, a signal supplied to the signal input driver 1 is transferred on the trunk wire 2 to the plurality of the synchronizing circuits 301 to 332, during which a wire-induced delay is created within the trunk wire 2. Hence, the signal arrives at the synchronizing circuits with a greater delay as the synchronizing circuits are farther from the driver 1. Differences in signal transmission time among the synchronizing circuits 301 to 332 is known as skews.

Basically, a skew developed within the trunk wire 2 is strongly influenced by a wire resistance R, a wire capacitance C1 of the trunk wire 2 and an input capacitance Ci of the synchronizing circuits as a whole. The skew, which is desired to be reduced, is expressed as a function of $R \times (C1+Ci)$. Since the wire resistance R is in inverse proportion to the width of the trunk wire 2, in the trunk type system, the trunk wire 2 is formed to have a large width so that the wire resistance R is suppressed small to reduce the skews.

On the other hand, the wire capacitance C1 increases in proportion to the width of the trunk wire 2. Hence, effective reduction of the skews by the wire resistance R is possible only when the input capacitance Ci is sufficiently larger than the wire capacitance C1. Even in such a case, however, as the width of the trunk wire 2 is formed larger and larger, the skews would amount as much as a time constant $R \times C1$ of the wire. Once increased to nearly $R \times C1$, the skew will not become smaller from that value. Further, since the wire resistance R and the wire capacitance C1 are each in proportion to the length of the trunk wire 2, the skews increase as the trunk wire 2 becomes longer.

(A-2) Conventional Technique using Tree Type System:

FIG. 21 is a circuitry diagram showing a conventional tree type signal supply method. This method is known as a driving method for supplying a signal to a plurality of synchronizing circuits which are arranged on the same straight line. An output terminal of the signal input driver circuit 1 is connected to a tree wire 200a. Input terminals of the synchronizing circuits 301 to 332 of the synchronizing circuit group 300a are also respectively connected to the tree wire 200a.

In the tree type system, the wire is disposed so that the paths (i.e., wires) from the signal input driver circuit 1 to the respective synchronizing circuits 301 to 332 have the same distance. Hence, unlike the trunk type system described at the section (A-1), the respective paths create the same amount of a signal delay, which reduces the skews of the transmitted signal among the synchronizing circuits to zero in an optimal case.

However, as shown in FIG. 21, a large signal wire area is needed to permit that the wires for supplying a signal to the thirty-two synchronizing circuits 301 to 332 have the same length. For instance, wires 201 to 206 disposed in a direction parallel to the arrangement of the synchronizing circuits 301 to 332 in a 6-layer structure, and hence, an area for forming such wires are necessary. This area for the wires becomes larger as an increased number of the synchronizing circuits are used. In addition, when the synchronizing circuits are not arranged at equal intervals or when the number of the synchronizing circuits cannot be expressed as $2^n$ or in some other cases, a detour wire must be disposed in a portion of the wire paths in order to adjust a delay time.

(A-3) Associated Problems:

As described above, supply of a signal to a plurality of synchronizing circuits using the trunk and the tree type systems has the following problems.

Problem 1: In the conventional trunk type system where a signal is transferred in a manner described above to the synchronizing circuits which are arranged on the same straight line, a reduction in the value of the skew to nearly zero is physically impossible. If the synchronizing circuits are arranged with a large distance from each other, in particular, even suppression of the skew, let alone a reduction of the skew to nearly zero, is physically impossible.

Particularly in the field of semiconductor, since semiconductor devices become increasingly dense and have a greater capacitance and a larger chip area while more accuracy of a timing signal is demanded due to a higher operation frequency, the trunk type system cannot easily attain a desired timing control among a plurality of synchronizing circuits.

Problem 2: In the conventional tree type system, to deal with a changed condition such as an increase in the number of synchronizing circuits and a necessity of disposing a detour wire for adjustment of a delay time, a large wire area is inevitably and unavoidably necessary for forming wires in a tree-configuration. Especially in the field of semiconductor, this is emerging as an obstruct which prohibits an improvement in the integration of a semiconductor device. One of other problems is an increase in the wire capacitance due to the arrangement in which many wires are located adjacent to each other. Because of these environmental differences with respect to the signal wires, a large skew is often created among synchronizing circuits.

SUMMARY OF THE INVENTION

A signal supply circuit according to a first aspect of the present invention comprises: (a) at least one first signal transmitting element each including an output end and an input end which receives an input signal; (b) a first wire including a first end and a second end, the first and being connected to the output end of one of the at least one first signal transmitting element; (c) a plurality of second signal transmitting elements each including an input end and an output end, the input ends of the second signal transmitting elements being connected to the first wire; (d) a second wire which is connected to the output ends of the second signal transmitting elements; and (e) a plurality of output terminals which are connected to the second wire at different positions. The input ends of the plurality of the second signal transmitting elements are connected to the first wire at different positions, and the output ends of the plurality of the second signal transmitting elements are connected to the second wire at the different positions.

Preferably, the first and the second wires are arranged parallel to each other.

According to a second aspect of the present invention, in the signal supply circuit of the first aspect, the input ends of the plurality of the second signal transmitting elements are connected to the first wire at equal intervals.

According to a third aspect of the present invention, in the signal supply circuit of the second aspect, the output ends of the plurality of the second signal transmitting elements are connected to the second wire at equal intervals.

In a fourth aspect of the present invention, the signal supply circuit of the first aspect includes two first signal transmitting elements. The output end of one of the two first signal transmitting elements other than the one of the at least one first signal transmitting element is connected to the second end of the first wire, and the input signal is given to the input end of any one of the two first signal transmitting elements.

In a fifth aspect of the present invention, the signal supply circuit of the first aspect includes a plurality of first wires. The signal supply circuit further comprises (f) a tree-like wire including an output end and an input end, the output end of the tree-like wire being connected to the first end of any one of the plurality of the first wires, the input end of the tree-like wire being connected to the output end of the first signal transmitting element.

In a sixth aspect of the present invention, the signal supply circuit of the first aspect further comprises (g) a plurality of tree-like wires which are disposed in correspondence to the output terminals, each one of the tree-like wires including: (g-1) an input end which is connected to a relevant one of the output terminals; and (g-2) a plurality of output ends for dividing and outputting a signal which is received at the input end of each one of the tree-like wires.

In a seventh aspect of the present invention, the signal supply circuit of the first aspect further comprises: (h) a plurality of third signal transmitting elements which are disposed in correspondence to the output terminals, each one of the plurality of the third signal transmitting elements including an input end and an output end, the input end of each one of the third signal transmitting elements being connected to each one of the output terminals; (i) a third wire, the output ends of the third signal transmitting elements being connected to the third wire at different positions; and (j) a plurality of output lines which are connected to the third wire at different positions.

According to an eighth aspect of the present invention, in the signal supply circuit of the seventh aspect, the input ends of the plurality of the second signal transmitting elements are connected to the first wire at equal intervals.

According to a ninth aspect of the present invention, in the signal supply circuit of the eighth aspect, the output ends of the plurality of the second signal transmitting elements are connected to the second wire at equal intervals.

A signal supply circuit according to a tenth aspect of the present invention comprises: (a) a signal transmitting main element including an input end and an output end, an input signal being given to the input end; (b) a mesh-like wire; and (c) at least one pair of signal supply means, each one of the signal supply means including: (c-1) an input terminal which is connected to the output end of the signal transmitting main element; (c-2) a plurality of output terminals; (c-3) a first signal transmitting element which includes an input end and an output end, the input end of the first signal transmitting element being connected to the input terminal; (c-4) a first wire which includes a first end and a second end, the first end being connected to the output end of the first signal transmitting element; (c-5) a plurality of second signal transmitting elements each including an input end and an output end, the input end of each of the second signal transmitting elements being connected to the first wire; (c-6) a second wire, the output ends of the plurality of the second signal transmitting elements being connected to the second wire at different positions; and (c-7) a plurality of third signal transmitting elements which are disposed in correspondence to the plurality of the output terminals, the output terminals being connected to the second wire at different positions through the third signal transmitting elements. The pair of signal supply means is disposed in such a manner that the signal supply means are located at opposite ends of the mesh-like wire. In each one of the signal supply means, the output terminals are connected to the mesh-like wire. The input ends of the plurality of the second signal transmitting elements are connected to the first wire at different positions, and the input terminals of the signal supply means are connected to the output end of the signal transmitting main element with the same distance.

According to an eleventh aspect of the present invention, in the signal supply circuit of the tenth aspect, there are two pairs of signal supply means disposed in such a manner that the signal supply means of each pair are located at opposite ends of the mesh-like wire, and the input terminals of all of the signal supply means are connected to the output end of the signal transmitting main element with the same distance.

The signal supply circuit of the eleventh aspect preferably further comprises (d) a pair of signal transmitting sub elements, each one of the signal transmitting sub elements including an input end and an output end, the input end of each one of the signal transmitting sub elements being connected to the output end of the signal transmitting main element, the input terminal of one of the signal supply means which forms one of the pairs of the signal supply means and the input terminal of one of the signal supply means which forms the other of the pairs of the signal supply means being connected in common to the output end of each one of the signal transmitting sub elements.

A signal supply circuit according to a twelfth aspect of the present invention comprises: (a) a signal transmitting main element including an input end and an output end, an input signal being given to the input end of the signal transmitting main element; (b) a plurality of first signal supply means which are arranged in one direction, each including: (b-1) a pair of input terminals; (b-2) pairs of output terminals; (b-3) a pair of first signal transmitting elements, the first signal transmitting elements each including an input end and an output end, the input end of one of the first signal transmitting elements being connected to each of the input terminals;

(b-4) a first wire which includes a first end and a second end, the first end being connected to the output end of one of the first signal transmitting elements, the second end being connected to the output end of the other one of the first signal transmitting elements; (b-5) a plurality of second signal transmitting elements each including an input end and an output end, the input end of each of the second signal transmitting elements being connected to the first wire; (b-6) a second wire, the output ends of the plurality of the second signal transmitting elements being connected to the second wire at different positions; and (b-7) a plurality of third signal transmitting elements which are disposed in correspondence to the pairs of the output terminals, the output terminals of each one of the pairs being connected to the second wire at different positions through the third signal transmitting elements, (c) a pair of second signal supply means which is disposed in such a manner that the second signal supply means are located at opposite ends of an array of the first signal supply means, each including: (c-1) an input terminal which is connected to the output end of the signal transmitting main element; (c-2) a plurality of output terminals which are disposed in correspondence to the first signal supply means, the output terminals being respectively connected to the input terminals of the first signal supply means; (c-3) a fourth signal transmitting element which includes an input end and an output end, the input end of the fourth signal transmitting element being connected to the input terminal; (c-4) a third wire which includes a first end and a second end, the first end of the third wire being connected to the output end of the fourth signal transmitting element; (c-5) a plurality of fifth signal transmitting elements each including an input end and an output end, the input ends of the fifth signal transmitting elements being respectively connected to the third wire; (c-6) a fourth wire, the output ends of the plurality of the fifth signal transmitting elements being connected to the fourth wire at different positions; and (c-7) sixth signal transmitting elements which are disposed in correspondence to the plurality of the output terminals, the output terminals being connected to the fourth wire at different positions through the sixth signal transmitting elements. The input ends of the second signal transmitting elements being connected to the first wire at different positions through the sixth signal transmitting elements, the input ends of the fifth signal transmitting elements being connected to the third wire at different positions through the fifth signal transmitting elements, and the input terminals of all of the pair of the second signal supply means are connected to the output end of the signal transmitting main element with the same distance.

In the signal supply circuit according to the twelfth aspect of the present invention, the number of the output terminals of each one of the first signal supply means is preferably the same.

According to a thirteenth aspect of the present invention, the signal supply circuit of the twelfth aspect further comprises (d) a mesh-like wire which is disposed in a region which is sandwitched by the second signal supply means and in which the first signal supply means are arranged, the mesh-like wire including: (d-1) a side which is connected to the output terminals of the second signal supply means; and (d-2) an internal wire which is connected to the output terminals of the first signal supply means.

Thus, according to the first aspect of the present invention, when a transition of the input signal occurs in the signal supply circuit, first, the second signal transmitting element which is disposed closest to the output terminal of the first signal transmitting element starts transmitting the transition to the second wire. At the output terminal of the second signal transmitting element which is disposed closest to the output terminal of the first signal transmitting element, a transition starts slowly at first and becomes steep with time. On the other hand, the second signal transmitting element which is disposed farthest from the output terminal of the first signal transmitting element starts transmitting the transition of the input signal latest among the second signal transmitting elements. The transition at the output terminal of this second signal transmitting element is acute. Hence, with respect to a time at which the potentials at the output terminals of the second signal transmitting elements reach the predetermined threshold value, a difference (i.e., a skew) is reduced between the output terminal of the second signal transmitting element which is disposed closest to the output terminal of the first signal transmitting element and the output terminal of the second signal transmitting element which is disposed farthest from the output terminal of the first signal transmitting element.

In the second aspect of the present invention, since the two first signal transmitting elements supply the input signal to the first wire from the two opposing sides, a skew is better reduced.

The effect achieved in the first aspect of the present invention is ensured even if the tree style system is included in the signal supply circuit as in the signal supply circuits of the third and the fourth aspects of the present invention.

In the signal supply circuit of the fifth aspects of the present invention, since the third signal transmitting elements function similarly to the second signal transmitting elements, a further reduction in a skew is possible.

In the signal supply circuit of the sixth aspects of the present invention, since the signal supply means transmit the input signal to the mesh-like wire while performing a similar operation to that of the signal supply means of the first aspect and since the input signal is divided and delivered by the mesh-like wire, a still further reduction in a skew is possible.

In the signal supply circuit of the seventh aspects of the present invention, since there are two pairs of the signal supply means of the sixth aspect, a still further reduction in a skew is possible.

In the signal supply circuit of the eighth aspects of the present invention, the first signal supply means perform a similar operation to that of the signal supply means of the second aspect, and the second signal supply means perform a similar operation to that of the signal supply circuit of the first aspect. Since there is no need to fix the number of the output terminals of the first signal supply means, it is possible to transmit the input signal while suppressing a skew even if there is a logic element which is as large as a mega cell.

As described above, the present invention only requires a small area to supply a signal to even a large number of synchronizing circuits while reducing skews among the synchronizing circuits.

Accordingly, it is an object of the present invention to offer a technique according to which an area necessary for supplying a signal to synchronizing circuits is suppressed small while suppressing a skew even when the number of the synchronizing circuits is large.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
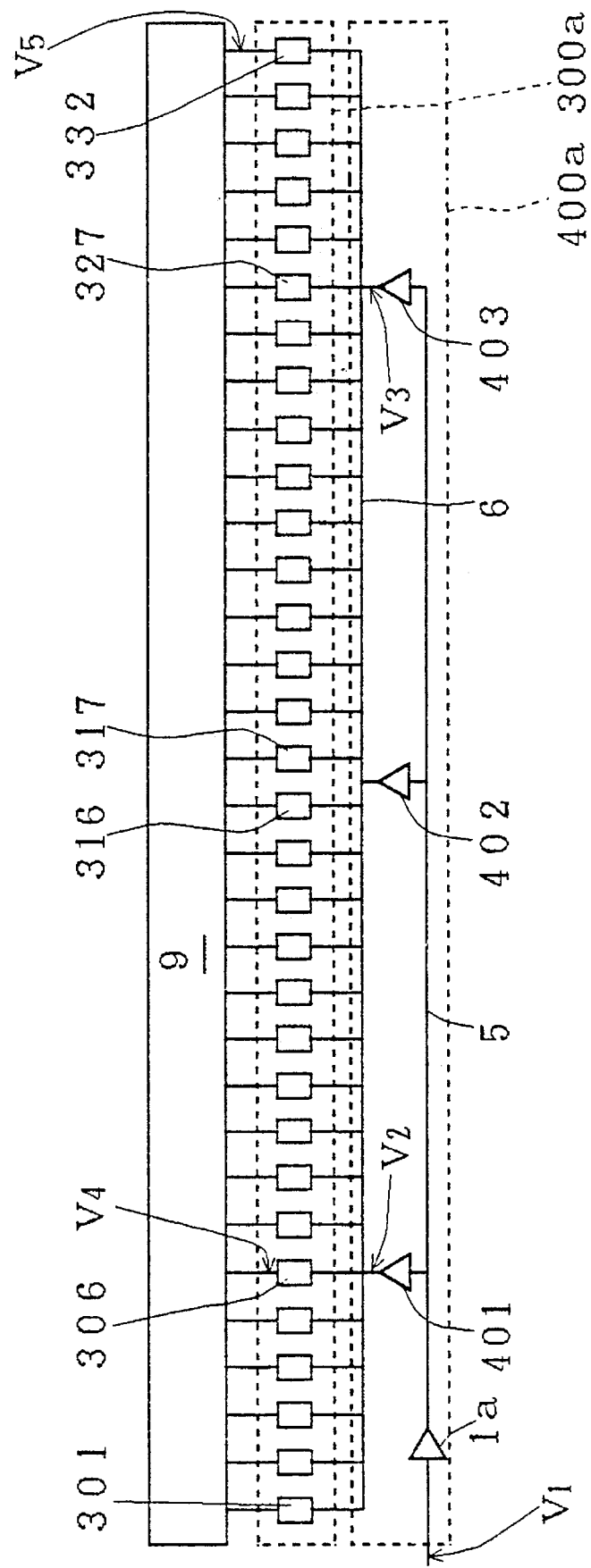
FIG. 1 is a circuitry diagram showing a structure according to a first preferred embodiment of the present invention.

B. Description of Preferred Embodiments:

(B-1) First Preferred Embodiment:

FIG. 1 is a circuitry diagram showing a structure of a signal supply circuit 400a and how the signal supply circuit 400a according to a first preferred embodiment of the present invention is connected to a synchronizing circuit group 300a.

The synchronizing circuit group 300a includes thirty-two synchronizing circuits 301 to 332 to which a signal is to be supplied. Although not all of the synchronizing circuits 301 to 332 are shown with associated reference numerals for clarity of illustration, the synchronizing circuits 301 to 332 are arranged in this order from the left-hand side to the right-hand side on the same straight line at equal intervals from each other. Input capacitances of the synchronizing circuits 301 to 332 are the same. The synchronizing circuits 301 to 332 each have an input terminal and an output terminal which is connected to a logic circuit 9.

The signal supply circuit 400a comprises four driver circuits 1a, 401, 402 and 403. An input signal which is to be supplied to the synchronizing circuits 301 to 332 is inputted to the driver circuit 1a. The input signal is, for example, a binary signal which has exclusive logic levels "H" and "L." An output of the driver circuit 1a is given to the left-hand side end of a first wire 5. At the left-hand side end, the right-hand side end and the center of the first wire 5, the driver circuits 401, 403 and 402 are formed, respectively. Outputs of these driver circuits are routed to a second wire 6. The input terminals of the synchronizing circuits 301 to 332 are connected to the second wire 6. To be particularly noted is that the input terminal of the synchronizing circuit 306 is connected to a node between the driver circuit 401 and the second wire 6, that the input terminal of the synchronizing circuit 327 is connected to a node between the driver circuit 403 and the second wire 6, and in addition, that the output terminal of the driver 402 is connected to a node which is located midway between nodes connecting the synchronizing circuits 316 and 317 to the second wire 6.

In other words, the driver circuits 401, 402 and 403 are arranged at equal intervals to each other in such a manner that the driver circuits 401, 402 and 403 handle almost the same amounts of an output capacitance. The first wire 5 and the second wire 6 are disposed parallel to each other.

Figure 2:
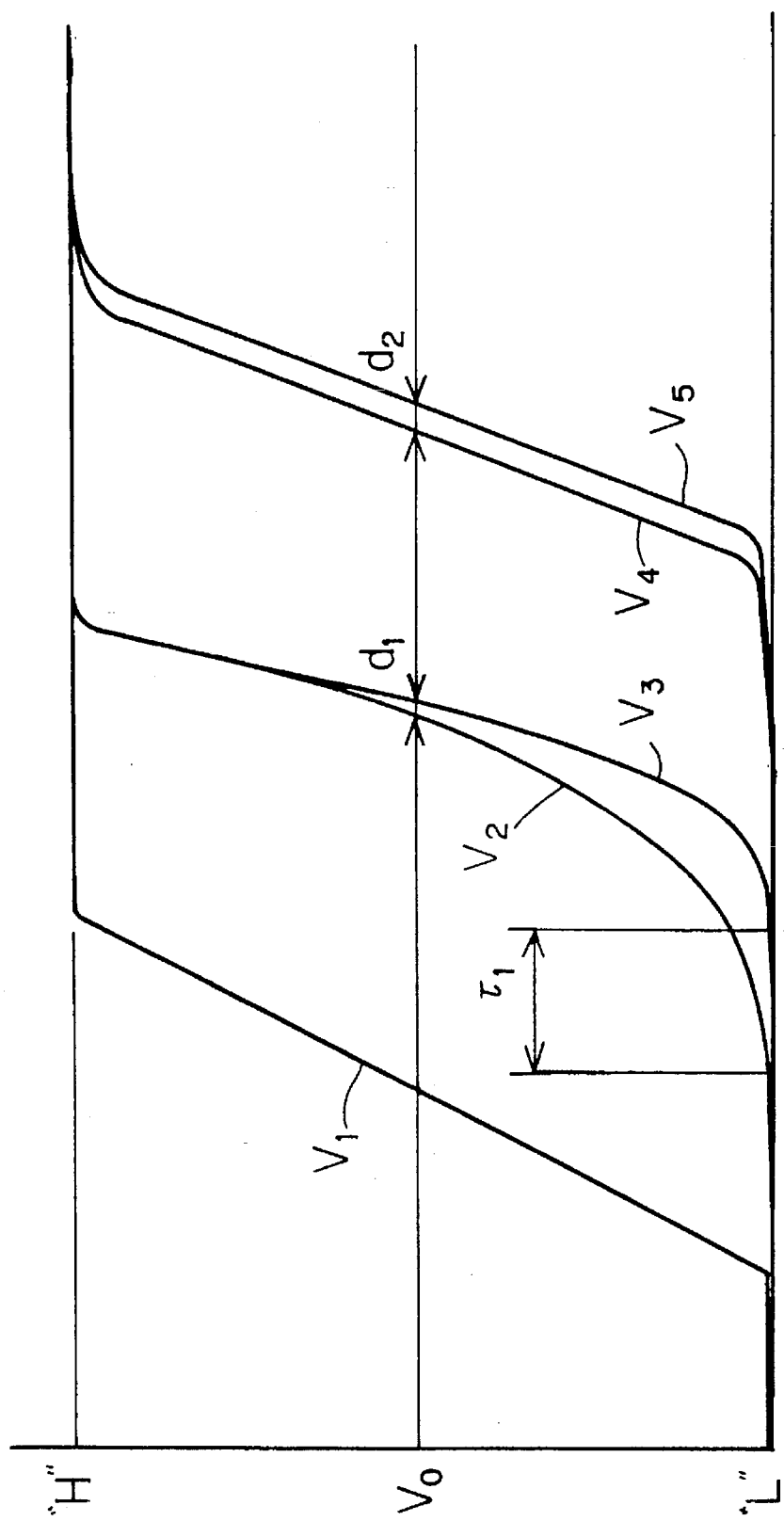
FIG. 2 is a waveform diagram for explaining an operation in the first preferred embodiment of the present invention.

FIG. 2 is a waveform diagram showing rises of potentials at major nodes in the circuit of FIG. 1. Symbols $V_1$, $V_2$, $V_3$, $V_4$ and $V_5$ represent a potential of the input signal, a potential at the output terminal of the driver circuit 401, a potential at the output terminal of the driver circuit 403, a potential at the output terminal of the synchronizing circuit 306 and a potential at the output terminal of the synchronizing circuit 332, respectively. A symbol $V_0$ represents a threshold voltage which is commonly used for the respective driver and synchronizing circuits. The threshold voltage is set at an intermediate binary value between the logical levels "H" and "L."

Since the potential $V_1$ which rises in a manner as that shown in FIG. 2 is given to the driver circuit 1a, after the potential $V_1$ reaches the potential $V_0$, the potential $V_2$ at the output terminal of the driver circuit 401 which is located nearest to the driver circuit 1a starts rising. At the beginning of transmission of a transition of the signal by the driver circuit 401 (Transmission of the signal transition will be referred to simply as "transmission" in the following description. Although the signal is transferred at any time on demand, the term "transmission" will be hereinafter used to particularly refer to a transition of the signal.), the driver circuits 402 and 403, which are farther from the driver circuit 1a than the driver circuit 401, have not started transmission yet. Hence, the driver circuit 401 performs transmission, that is, charging or discharging of a capacitance which is coupled to the second wire 6, alone by itself versus the driver circuits 402 and 403 which are still supplying an opposite logic to the second wire 6. In such an environment, the potential $V_2$ rises relatively slowly.

Lagging behind the driver circuit 401 due to skews created on the first wire 5, the driver circuits 402 and 403 in sequence start transmission. As a result, the capacitance connected to the second wire 6 is charged or discharged not only by the driver circuit 401 alone but also by the driver circuits 402 and 403 as well. Hence, the potential $V_2$ increases steeply with time.

On the other hand, the driver circuit 403 at last starts transmission with a delay time of $\tau_1$ from the start of the transmission by the driver circuit 401 due to the skews created on the first wire 5. In transmitting the signal transition to the second wire 6, the driver circuit 403 charges or discharges the capacitance which is connected to the second wire 6 in a concerted manner with the driver circuits 401 and 402. Since there is no driver circuit which is supplying an opposite logic to the second wire 6 against the driver circuit 403 and since the capacitance which is connected in the vicinity of the output terminal of the driver circuit 403 has been already partially charged or discharged, the driver circuit 403 causes the potential thereat to exhibit the steepest transition among all driver circuits.

From the above, it is understood that of the signals outputted from the signal supply circuit 400a, both the signal which starts to transit earliest (i.e., the potential $V_2$) and the signal which starts to transit latest (i.e., the potential $V_3$) are similar to each other in that the signal level changes slowly at the beginning of the transition and steeply at the end of the transition. However, the signal which starts to transit later (i.e., the potential $V_3$) shows a steeper transition than the signal which starts to transit earlier (i.e., the potential $V_2$). It then follows that the time required for the potential $V_2$ to reach a certain level from the beginning of the transition is longer than the time required for the potential $V_3$ to reach a certain level from the beginning of the transition. Hence, a time difference between the waveforms of the potentials $V_2$ and $V_3$ decreases as the transitions of the signals proceed.

With respect to the time at which the potential reaches the threshold voltage, therefore, since the threshold voltage is set at a potential value which is nearly half the signal amplitude as described earlier, the time difference $d_1$ between the potentials $V_2$ and $V_3$ is suppressed small.

Since the outputs of the signal supply circuit 400a are obtained in such a manner, it is also possible to suppress a time difference $d_2$ between the time at which the potential $V_4$, which appears at the output terminal of the synchronizing circuit 306 in which the potential at the input terminal reaches the threshold voltage $V_0$ earliest, reaches the threshold voltage $V_0$ and the time at which the potential $V_5$, which appears at the output terminal of the synchronizing circuit 327 in which the potential at the input terminal reaches the threshold voltage $V_0$ latest due to the time difference $d_1$ and the skews which are created at the second wire 6, reaches the threshold voltage $V_0$. The potentials $V_4$ and $V_5$ transit approximately linearly since the waveforms thereof are reshaped at the synchronizing circuits 306 and 327.

As the number of the driver circuits, there is an optimal number with which all skews among the synchronizing circuits are minimized. When the number of the driver circuits is smaller than the optimal number, skews created within the second wire 6 increase. When the number of the driver circuits is larger than the optimal number, skews created within the first wire 5 increase.

Figure 3:
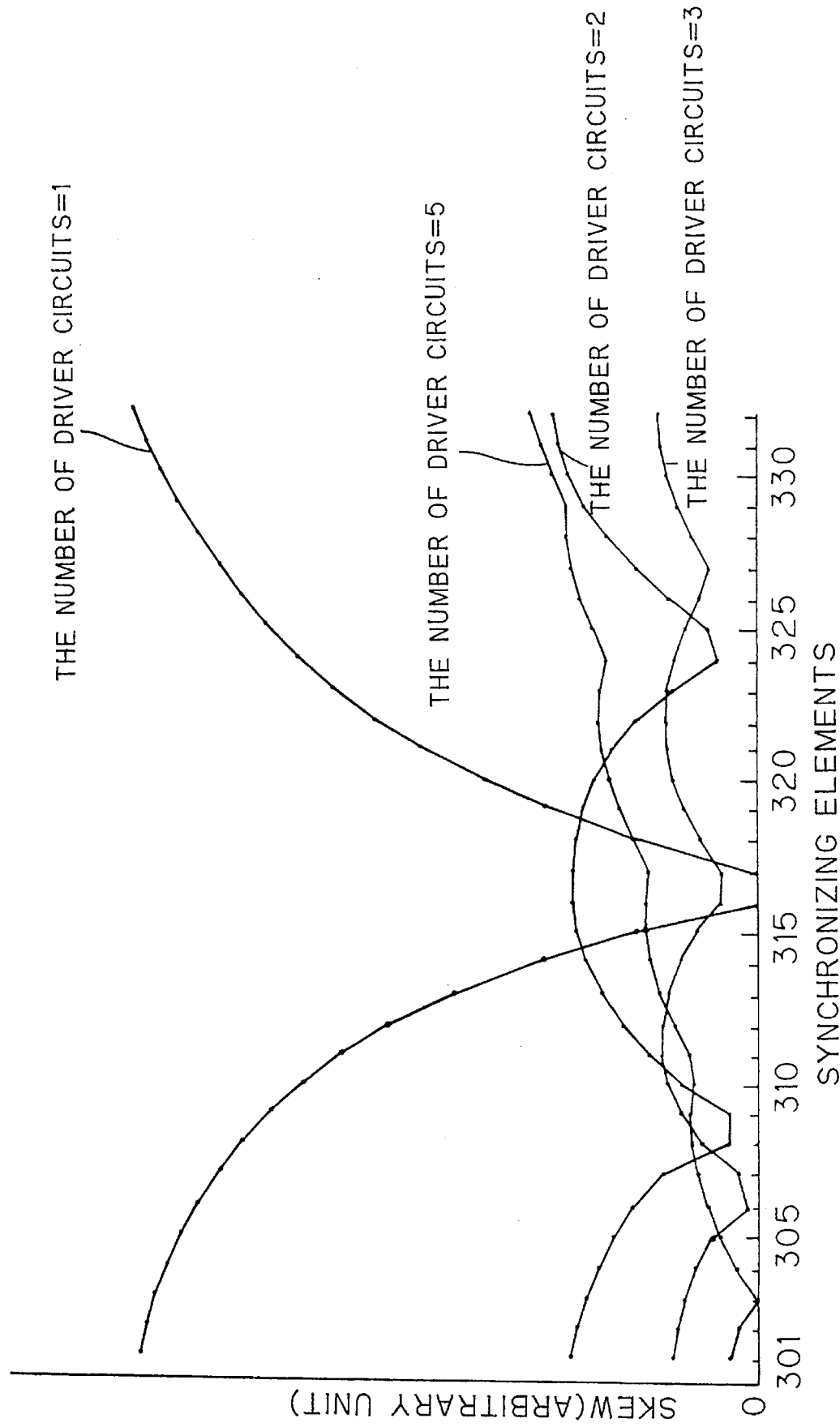
FIG. 3 is a graph for explaining the operation in the first preferred embodiment of the present invention.

FIG. 3 is a graph plotting skews (in unit of an arbitrary number) at all of the output terminals of the synchronizing circuits 301 to 332. A parameter is the number of the driver circuits which are disposed in the signal supply circuit 400a. Parameter values are 1, 2, 3 and 5. The graph assumes that the synchronizing circuits are also arranged at equal intervals, the driver circuits are arranged at equal intervals, and that the first and the second wires 5 and 6 do not each include a detour path. From FIG. 3, it is understood that the optimal number of the driver circuits is three.

The optimal number of the driver circuits has a dependence on the positions of the driver circuits between the first and the second wires 5 and 6 as well. The optimal number of the driver circuits is also influenced by the wire resistance, the wire capacitance, the input capacitances and the output capacitances of the driver circuits, the driving capabilities of the driver circuits, the input capacitances of the synchronizing circuits and the like. For this reason, the number of the driver circuits cannot be simply fixed. Rather, it is necessary to find the optimal number for actual use by means of simulation or other suitable process.

Figure 21:
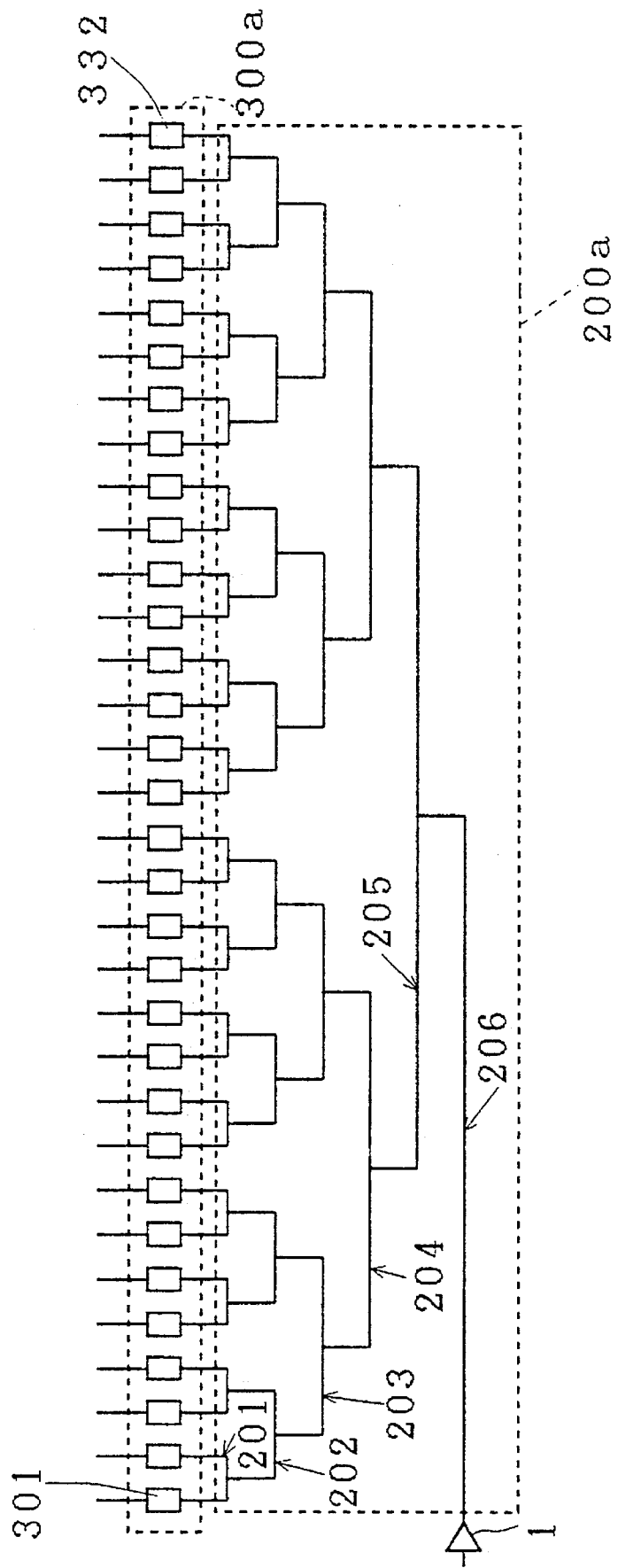

Additionally describing the difference between the first preferred embodiment and the tree type system, since the signal supply circuit 400a includes one driver circuit when there are two synchronizing circuits included in the synchronizing circuit group 300a, the first preferred embodiment on appearance looks similar to the conventional tree type system which is shown in FIG. 21.

However, in the present invention, there is no need to connect the output terminal of the driver circuit 1a to the center of the first wire 5, but rather the output terminal of the driver circuit 1a can be connected to the left-hand side end of the first wire 5 as shown in FIG. 1. In other words, the output terminal of the driver circuit 1a can be located on an extension of the first wire, and therefore, the wire 206 of FIG. 1 needs not be disposed.

In addition, even if there are a number of the synchronizing circuits formed in the synchronizing circuit group 300a, or even if the synchronizing circuits are not arranged at equal intervals, or even if the second wire 6 is long, unlike in the tree type system, almost no expansion of the area for forming the signal supply circuit 400a is necessary. Besides, the first preferred embodiment of the present invention is superior to the conventional tree type system in that it is possible to supply a signal without almost no difference in delay times among the synchronizing circuits by adjusting the number, the sizes and other parameters of the driver circuits within the signal supply circuit 400a.

As already described in "(A-2) Conventional Technique using Tree Type System" while the tree wire 200a demands the six layers of the wires 201 to 206 to accommodate to the thirty-two synchronizing circuits, the signal supply circuit 400a of the first preferred embodiment demands only the first and the second wires 5 and 6 and the driver circuits 401, 402 and 403.

Figure 4:
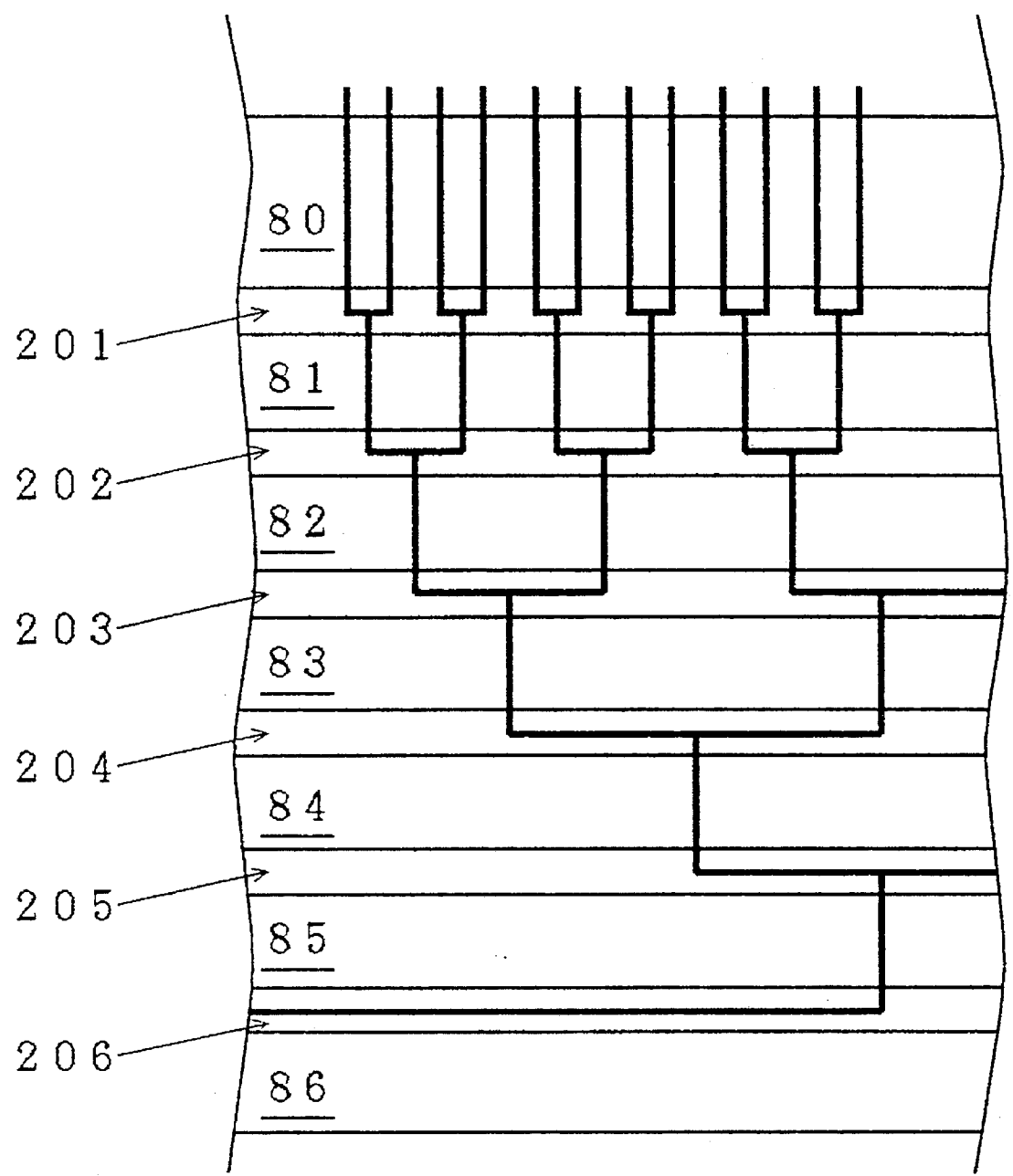
FIGS. 4 and 5 are plan views showing an effect of the first preferred embodiment of the present invention.
Figure 5:
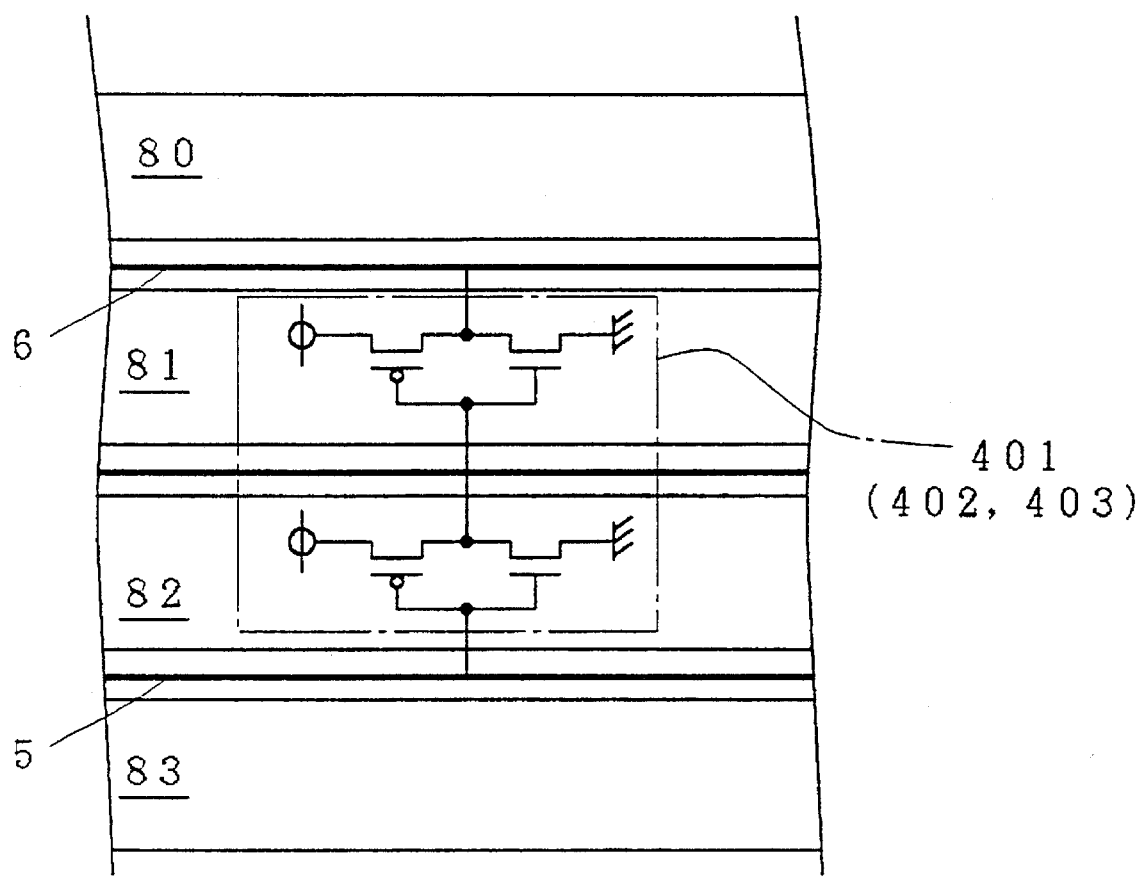

FIGS. 4 and 5 are plan views respectively partially showing the tree wire 200a and the signal supply circuit 400a each formed within a transistor array. The tree wire 200a requires that the wires 201 to 206 are formed at wire formation regions which exist between transistor arrays 80 to 86, and therefore, an area equivalent to at least five transistor arrays (81 to 85) is necessary. In contrast, the signal supply circuit 400a requires a smaller area since the driver circuit 401 as well as the other driver circuits 402 and 403 are each realized only in the two transistor arrays 81 and 82.

Figure 6:
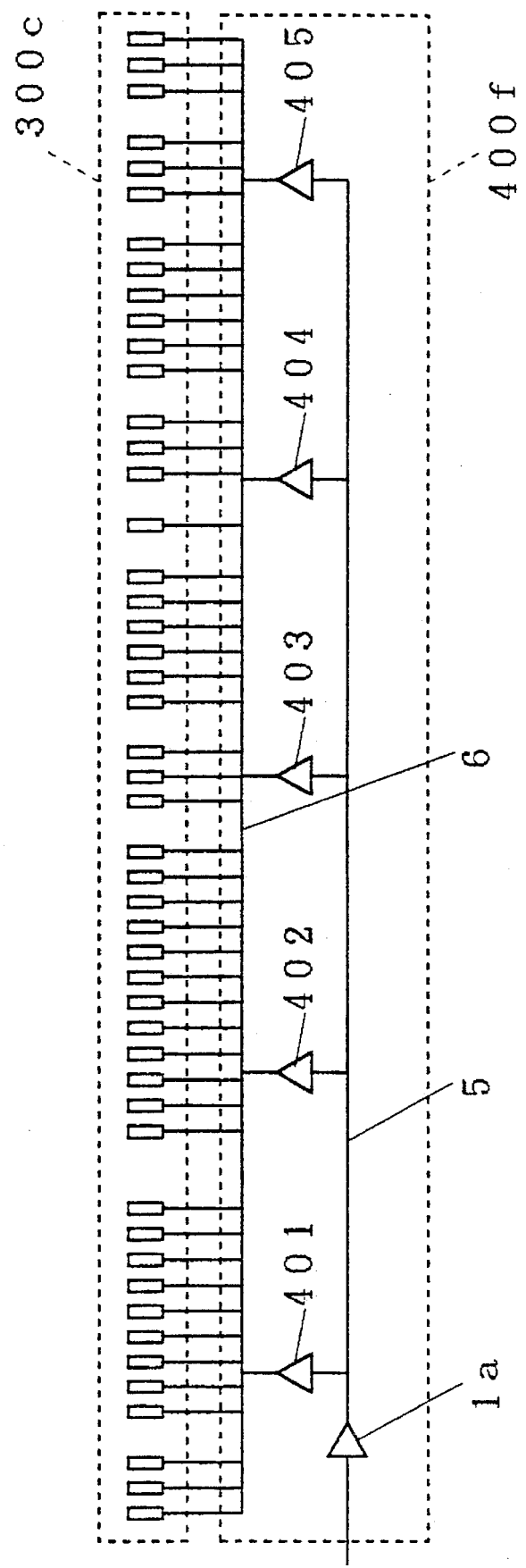
FIG. 6 is a circuitry diagram showing a modification of the first preferred embodiment of the present invention.

The circuit structure shown in FIG. 1 corresponds to where the synchronizing circuits are arranged at equal intervals. When the synchronizing circuits are arranged at equal intervals like this, it is easy to reduce skews to the synchronizing circuits. Yet, the effect of the present invention is still attained even when the synchronizing circuits are not arranged at equal intervals. FIG. 6 is a circuitry diagram showing where a signal supply circuit 400f is connected to a synchronizing circuit group 300c which includes synchronizing circuits which are not arranged at equal intervals. In this circuit structure, the signal supply circuit 400f comprises six driver circuits 401 to 405 and 1a. In this case as well, an effect as that described above is produced by adjusting the arrangement, the number and other parameters of the driver circuits.

It is also to be noted that the first preferred embodiment is not limited to where the synchronizing circuits are arranged on the same straight line as shown in FIG. 1.

Rather, a similar structure to that shown in FIG. 1 and hence a similar effect are obtained only if the input terminals of the synchronizing circuits can be connected to each other by the same single wire.

Figure 7:
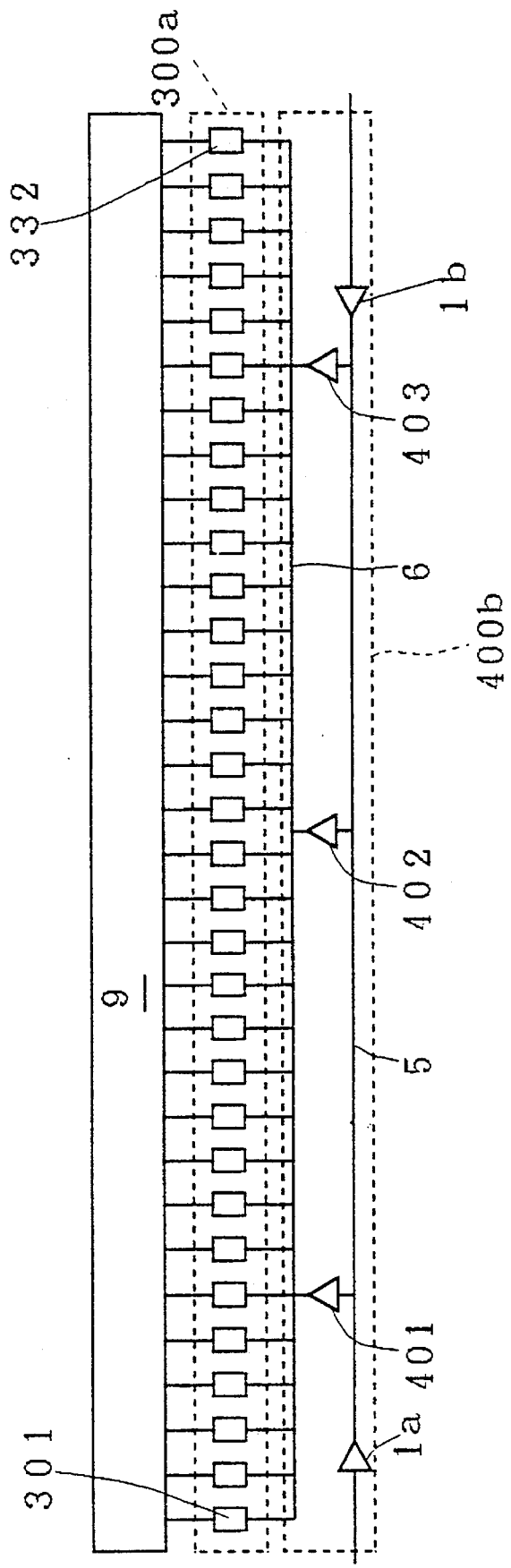
FIG. 7 is a circuitry diagram showing a second preferred embodiment of the present invention.

(B-2) Second Preferred Embodiment:

FIG. 7 is a circuitry diagram showing a structure of a signal supply circuit 400b according to a second preferred embodiment of the present invention and how the signal supply circuit 400b is connected to the synchronizing circuit group 300a.

The signal supply circuit 400b is the same as the signal supply circuit 400a as it is modified to further comprise a driver circuit 1b. The driver circuit 1b receives the same input signal as that supplied to the driver circuit 1a. An output terminal of the driver circuit 1b is connected to the right-hand side end of the first wire 5 similarly to the input terminal of the driver circuit 403.

Hence, by giving an input signal respectively from the left-hand side end and the right-hand side end of the first wire 5 through the driver circuits 1a and 1b, the driver circuits 401 and 403 start transmission approximately at the same time. The driver circuit 402 starts transmission belatedly depending on skews which are created by the first wire 5.

Since the two driver circuits 401 and 403 start transmission at the same time, the driver circuits 401 and 403 each only have to handle a smaller amount of the capacitance which is connected to the second wire 6 than in the first preferred embodiment. Further, at the start of transmission by the driver circuits 401 and 403, it is only the driver circuit 402 that is still providing an opposite logic to the second wire 6. Hence, in the second preferred embodiment, it is possible to further effectively reduce a time difference between when potentials at the output terminals of the driver circuits 401, 402 and 403 reach the potential $V_0$. It is also possible to further reduce skews at the output terminals of the respective synchronizing circuits.

Figure 8:
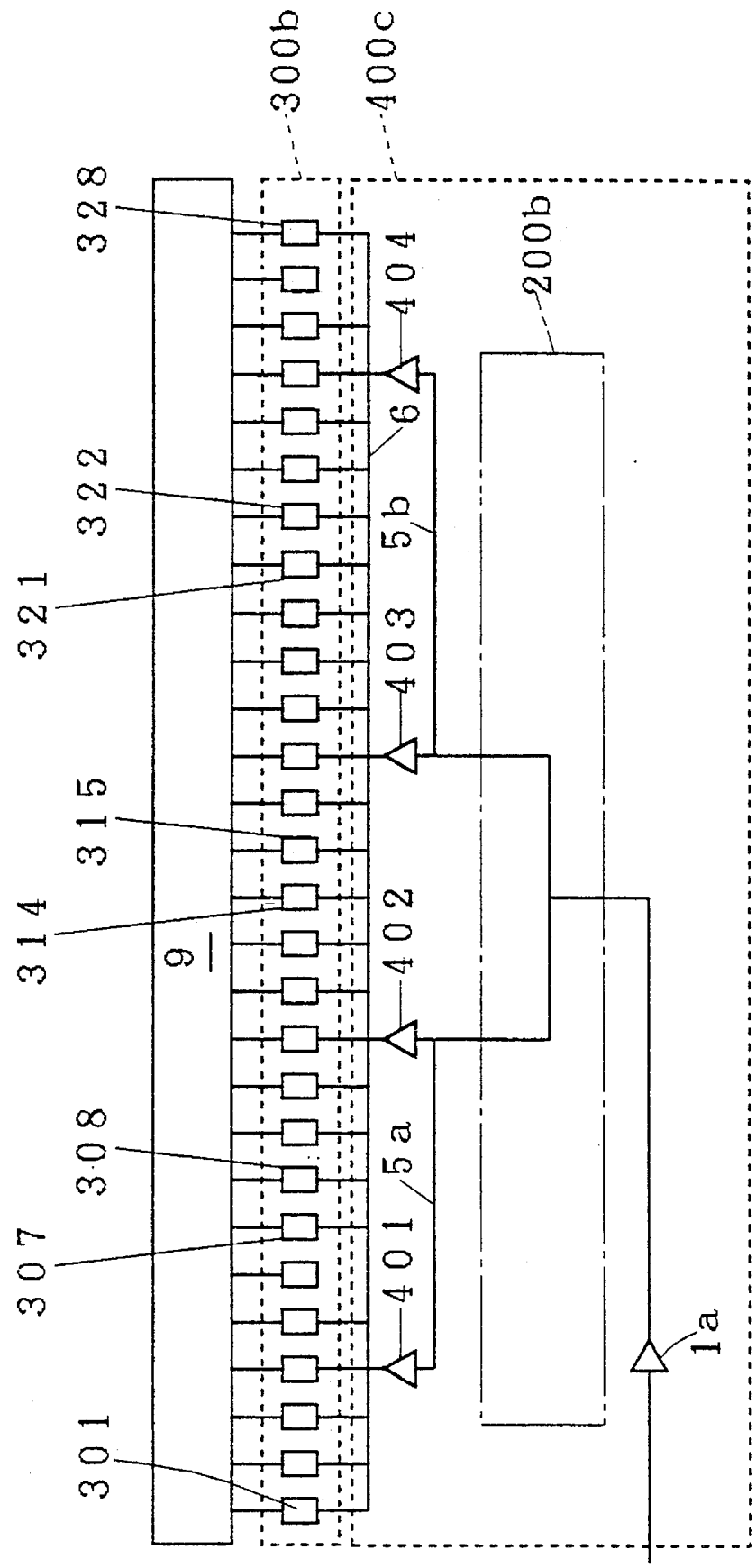
FIG. 8 is a circuitry diagram showing a third preferred embodiment of the present invention.

(B-3) Third Preferred Embodiment:

FIG. 8 is a circuitry diagram showing a third preferred embodiment of the present invention, and illustrates a structure of a signal supply circuit 400c and how the signal supply circuit 400c is connected to a synchronizing circuit group 300b.

The synchronizing circuit group 300b includes synchronizing circuits 301 to 328 which are linearly arranged at equal intervals. Although not all of the synchronizing circuits 301 to 328 are assigned with associated reference numerals for clarity of illustration, the synchronizing circuits 301 to 328 are arranged in this order from the left-hand side to the right-hand side on the same straight line at equal intervals from each other. The synchronizing circuits 301 to 328 have the same input capacitances. Each one of the synchronizing circuits 301 to 328 has an input terminal and an output terminal which is connected to the logic circuit 9.

The signal supply circuit 400c comprises driver circuits 1a and 401 to 404, two first wires 5a and 5b, a second wire 6 and a tree wire 200b. The signal supply circuit 400c is different from the signal supply circuit 400a of the first preferred embodiment in that input terminals of the driver circuits 401 to 404 are not connected to the same single wire. Though the driver circuits 401 to 404 are arranged at equal intervals, the input terminals of the driver circuits 401 and 402 are respectively connected to the left-hand side end and the right-hand side end of the first wire 5a, while the input terminals of the driver circuits 403 and 404 are connected to the left-hand side end and the right-hand side end of the first wire 5b, respectively.

The left-hand side end and the right-hand side end of the tree wire 200b are connected to the right-hand side end of the first wire 5a and the left-hand side end of the first wire 5b, respectively. An input signal is fed to an input terminal of the tree wire through the driver circuit 1a.

Since a transition of the signal is transmitted approximately at the same time to the right-hand side end of the first wire 5a and the left-hand side end of the first wire 5b by the tree wire 200b, the driver circuits 402 and 403 start transmission approximately simultaneously. With the driver circuits 402 and 403 operating in the manner described in relation to the first preferred embodiment, a time difference between output terminals of the driver circuits 401 and 402 is suppressed, and at the same time, so is a time difference between output terminals of the driver circuits 403 and 404. Thus, two operations each similar to those attained in the first preferred embodiment are performed concurrently, whereby skews are better reduced.

In the third preferred embodiment as well, as compared with where a signal is supplied merely by a tree wire, the effect of the invention becomes more remarkable as a larger number of the synchronizing circuits are used.

Figure 9:
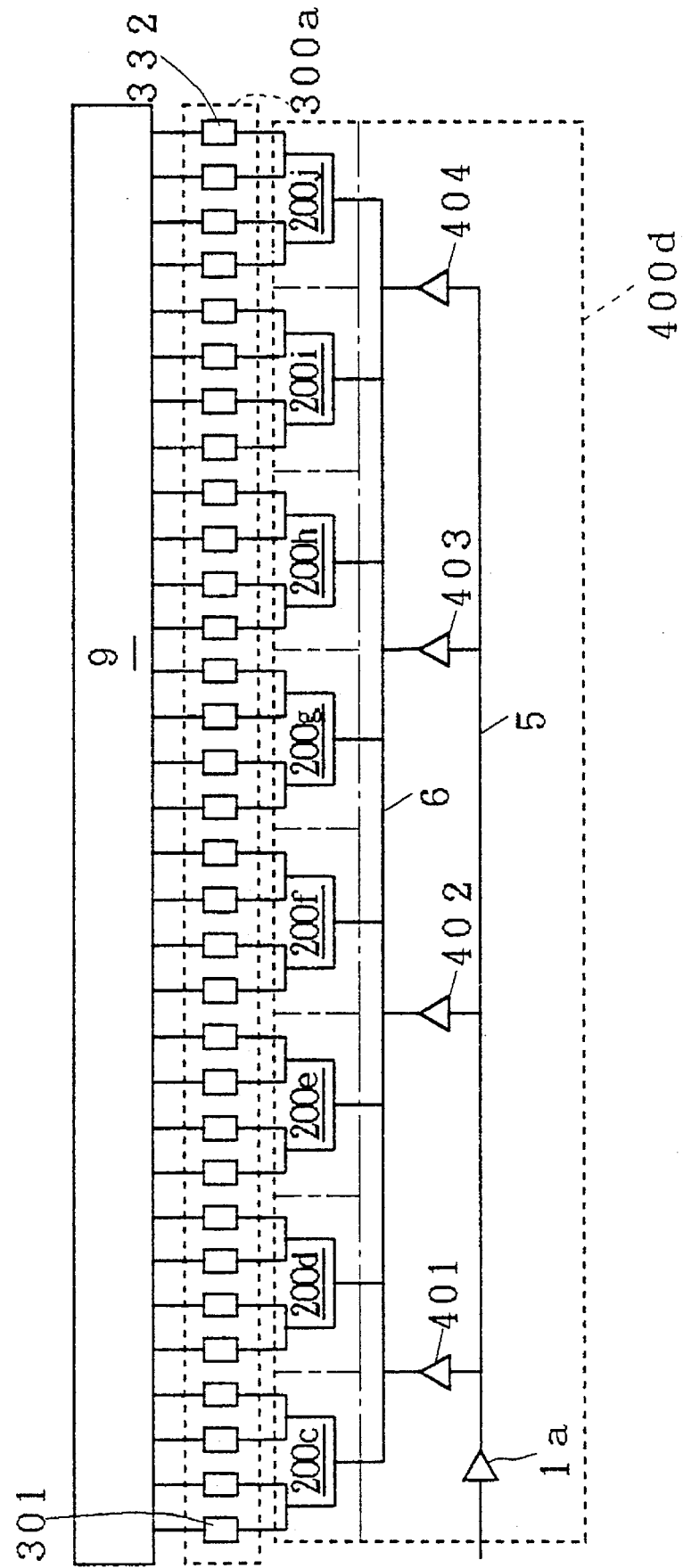
FIG. 9 is a circuitry diagram showing a fourth preferred embodiment of the present invention.

(B-4) Fourth Preferred Embodiment:

FIG. 9 is a circuitry diagram showing a fourth preferred embodiment of the present invention, and illustrates a structure of a signal supply circuit 400d and how the signal supply circuit 400d is connected to the synchronizing circuit group 300a.

The signal supply circuit 400d comprises driver circuits 1a and 401 to 404, a first wire 5 and tree wires 200c to 200j. Similarly to the signal supply circuit 400a of the first preferred embodiment, input terminals of the driver circuits 401 to 404 are connected to the first wire 5 and output terminals of the driver circuits 401 to 404 are connected to the second wire 6. The driver circuit 1a is connected to the left-hand side end of the first wire 5.

Input terminals of the tree wires 200c to 200j are connected to the second wire 6 at equal intervals and output terminals of the tree wires 200c to 200j are each connected to an input terminal of each synchronizing circuit of the synchronizing circuit group 300a. In this respect, the circuit structure of the fourth preferred embodiment is equivalent to a circuit structure wherein the first preferred embodiment is integrated in a portion of the conventional tree wire 200a. In such a structure, too, skews are reduced as in the first preferred embodiment. Referring again to the FIG. 5, the fourth preferred embodiment is advantageous in that the fourth preferred embodiment requires only four transistor arrays, or one array less than in the conventional tree wire 200a of FIG. 4.

Figure 10:
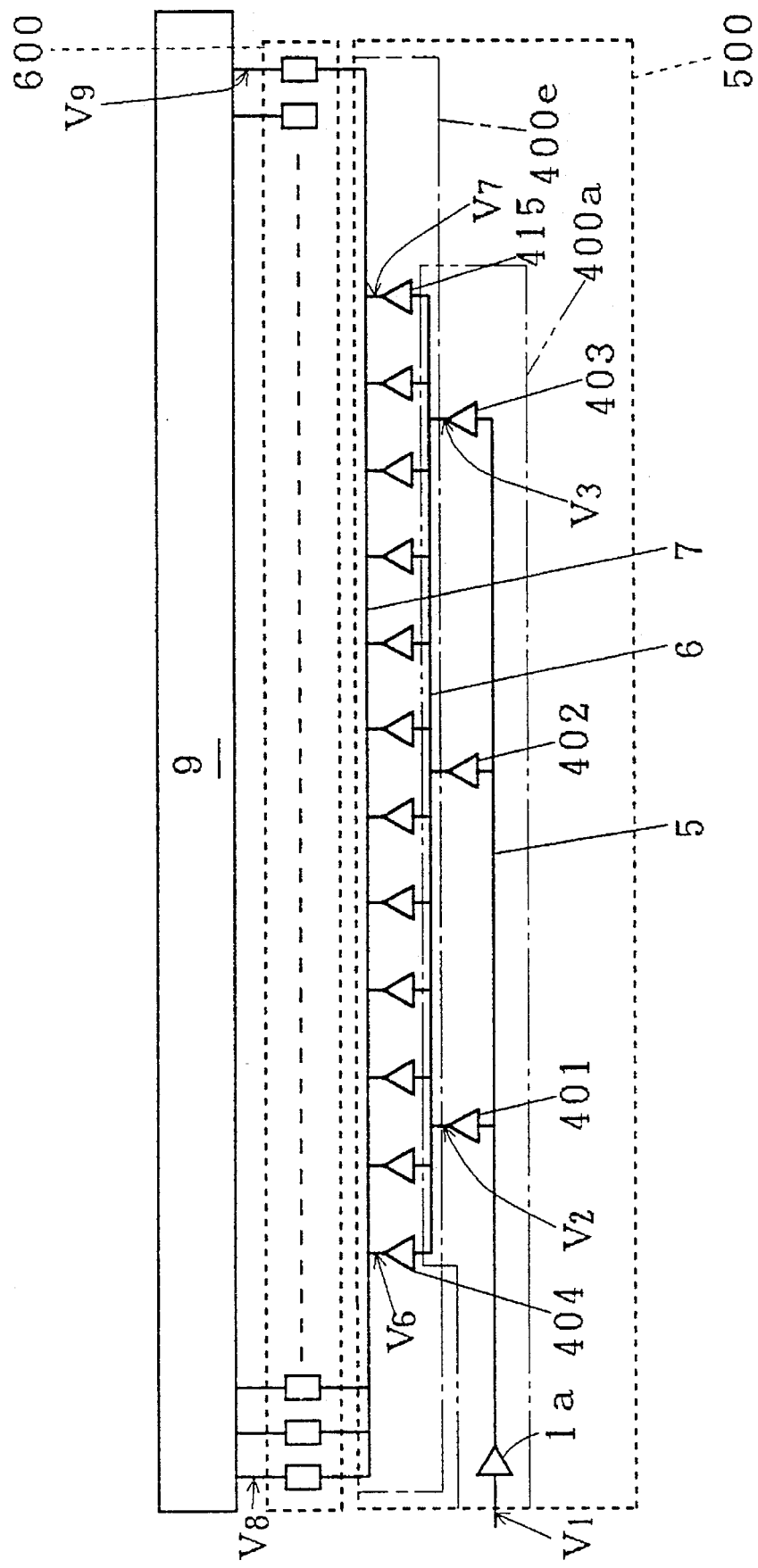
FIG. 10 is a circuitry diagram showing a fifth preferred embodiment of the present invention.

(B-5) Fifth Preferred Embodiment:

FIG. 10 is a circuitry diagram showing a fifth preferred embodiment of the present invention, and illustrates a structure of a signal supply circuit 500 and how the signal supply circuit 500 is connected to a synchronizing circuit group 600. The signal supply circuit 500 comprises a signal supply circuit 400e and the signal supply circuit 400a of the first preferred embodiment.

The signal supply circuit 400e comprises twelve driver circuits 404 to 415. Although not all of the driver circuits 404 to 415 are assigned with associated reference numerals for clarity of illustration, the driver circuits 404 to 415 are arranged in this order from the left-hand side to the right-hand side on the same straight line at equal intervals from each other. The second wire 6 belongs not only to the signal supply circuit 400a but also to 400e; that is, input terminals of the driver circuits 404 to 415 in the signal supply circuit 400e are connected to the second wire 6. The input terminal of the driver circuit 404 is connected to the left-hand side end of the second wire 6 while the input terminal of the driver circuit 415 is connected to the right-hand side end of the second wire 6. The signal supply circuit 400e also comprises a third wire 7 to which the output terminals of the driver circuits 404 to 415 are connected at equal intervals.

The synchronizing circuit group 600 includes a plurality of synchronizing circuits which are arranged on the same straight line, which feature being the same as that regarding the synchronizing circuit groups 300a and 300b. Input terminals of the synchronizing circuits are connected at equal intervals to the third wire 7 while the output terminals of the synchronizing circuits are connected to the logic circuit 9.

Figure 11:
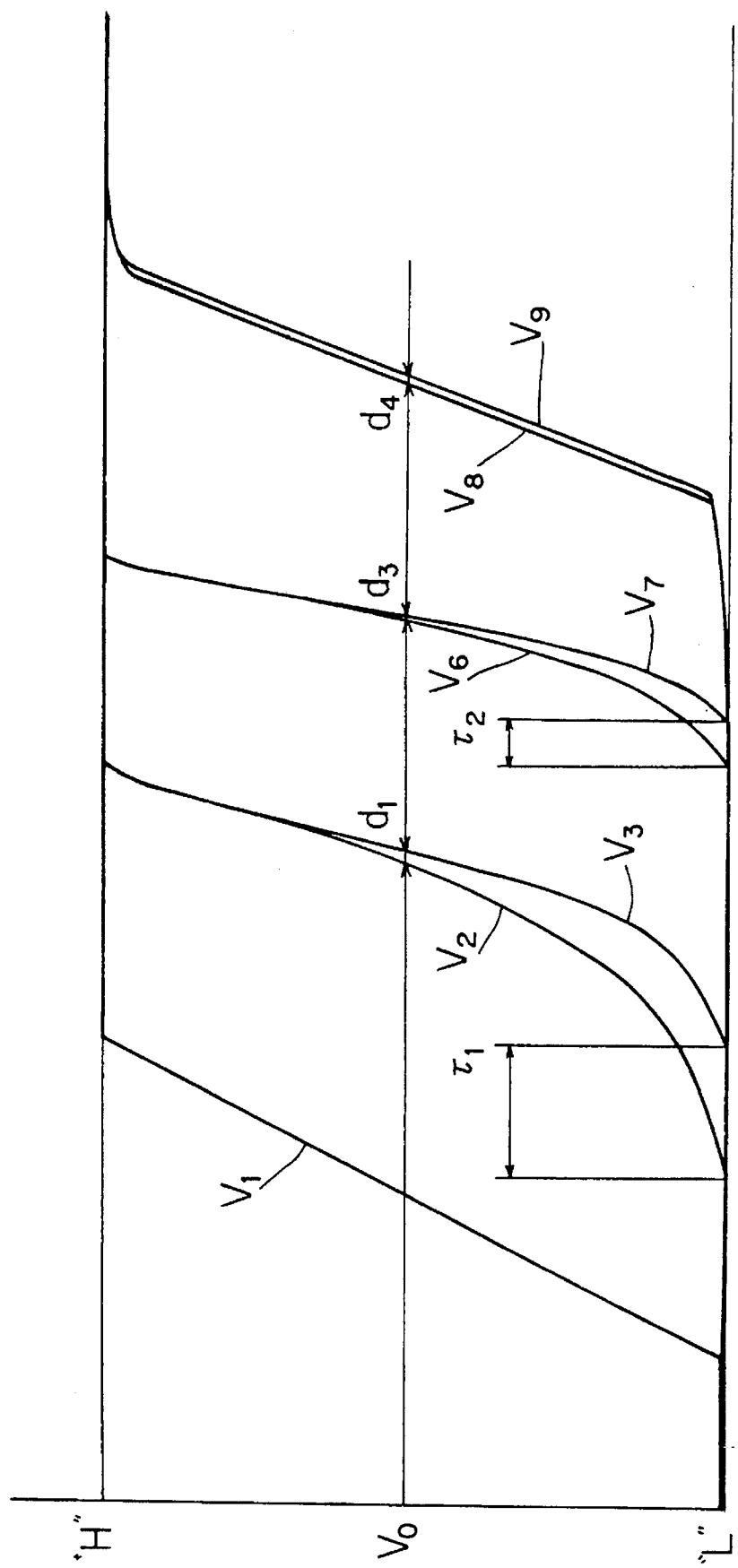
FIG. 11 is a waveform diagram for explaining an operation in the fifth preferred embodiment of the present invention.

The fifth preferred embodiment is equivalent to two circuit structures of the first preferred embodiment disposed in a two-stage construction so that a skew reduced at the second wire is further suppressed at the third wire 7. FIG. 11 is a waveform diagram showing how potential rise at major nodes in the circuit of FIG. 10. Symbols $V_1$, $V_2$, $V_3$, $V_6$, $V_7$, $V_8$ and $V_9$ represent a potential of the input signal, a potential at the output terminal of the driver circuit 401, a potential at the output terminal of the driver circuit 403, a potential at the output terminal of the driver circuit 404, a potential at the output terminal of the driver circuit 415, a potential at the output terminal of a synchronizing circuit which is located at the left-hand side end of the synchronizing circuit group 600, and a potential at the output terminal of a synchronizing circuit which is located at the right-hand side end of the synchronizing circuit group 600, respectively.

The difference in time $d_1$ between the potentials $V_2$ and $V_3$ in reaching the potential $V_0$ at the second wire 6 is suppressed small beyond a skew $\tau_1$ at the first wire 5. This allows that a skew $\tau_2$ at the third wire is also suppressed smaller than a skew $\tau_1$ at the first wire 5. Hence, a time difference $d_3$ between the potentials $V_6$ and $V_7$ in reaching the potential $V_0$ at the third wire 7 becomes smaller than the time difference $d_1$ between the potentials $V_2$ and $V_3$ in reaching the potential $V_0$ at the second wire 6. As a result, a time difference $d_4$ in reaching the potential $V_0$ between the potentials $V_8$ and $V_9$ which appear at the output terminals of the synchronizing circuits which are respectively located at the left-hand side and the right-hand side ends of the synchronizing circuit group 600 is smaller than the corresponding time difference of the first preferred embodiment (i.e., time difference $d_2$).

Although FIG. 10 shows that two circuit structures each as that of the first preferred embodiment are used in the two-stage construction, three or more such circuit structures may be used. In such a case, a further reduction in skews at the output terminals of the synchronizing circuits is possible.

Figure 12:
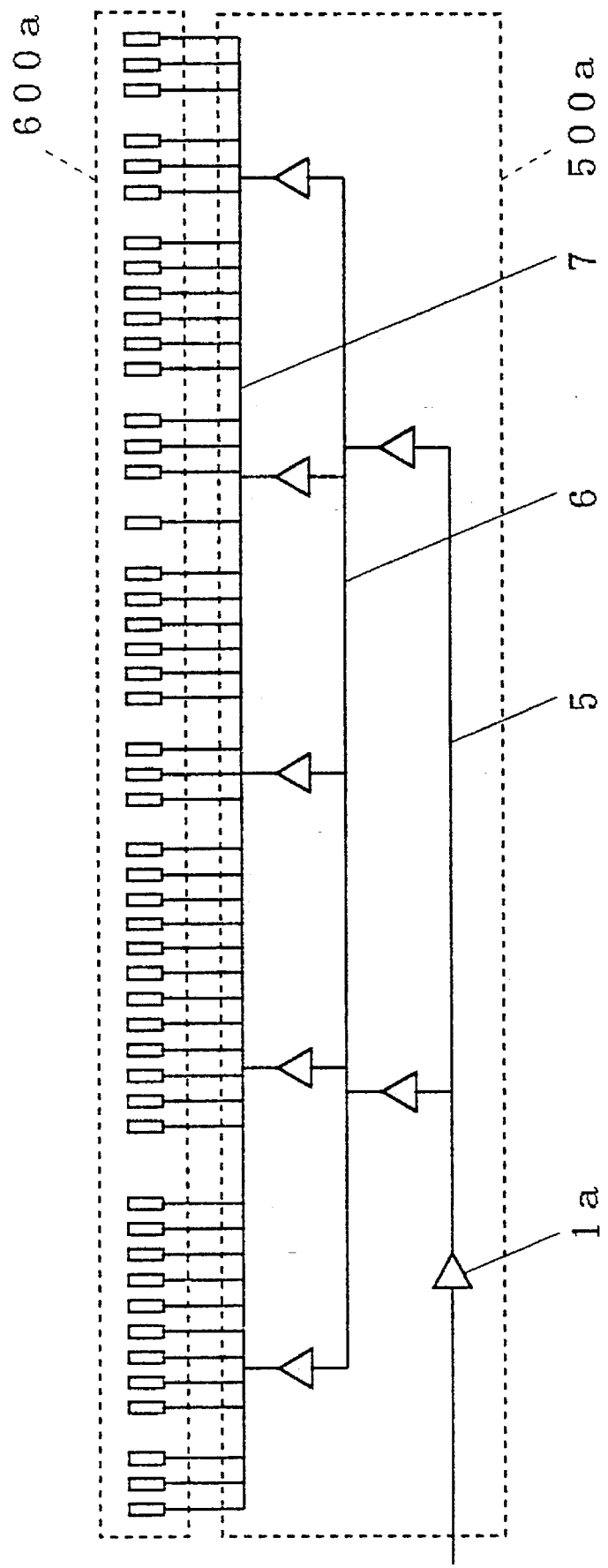
FIG. 12 is a circuitry diagram showing a modification of the fifth preferred embodiment of the present invention.

Similarly to the first preferred embodiment, the fifth preferred embodiment allows an irregular arrangement of the synchronizing circuits without sacrificing the effect of the fifth preferred embodiment. FIG. 12 is a circuitry diagram showing a structure in which a signal supply circuit 500a is connected to a synchronizing circuit group 600a which includes synchronizing circuits which are not arranged at equal intervals. Likewise the signal supply circuit 500, the signal supply circuit 500a comprises the first to the third wires 5 to 7, driver circuits are disposed between the first wire 5 and the second wire 6 and other driver circuits disposed between the second wire 6 and the third wire 7.

Additional description will be given here on a difference between the fifth preferred embodiment and the tree type system. If the synchronizing circuit group 600 includes four synchronizing circuits, the signal supply circuits 400a and 400e need to comprise one driver circuit and two driver circuits, respectively, which is basically the same as in the conventional tree type system of FIG. 21. However, it is to be noted that skews are suppressed twice through the first to the third wires, in the course of which an influence of environmental differences between wire paths from the respective synchronizing circuits to the associated driver circuits (i.e., whether there is any wire in the vicinity of these wires) over delays which are created at the wires is absorbed. Hence, skews are controlled more reliably. Thus, the fifth preferred embodiment is apparently more advantageous than the tree type system.

Further, even if there are a great number of the synchronizing circuits included in the synchronizing circuit group 600, or even if the synchronizing circuits are not arranged at equal intervals unlike in the tree type system or even if the third wire 7 is long, almost no expansion in the size of the signal supply circuit 500 is necessary. It is possible to supply a signal almost without a difference in delay time to the respective synchronizing circuits by adjusting the number, the sizes and the like of the driver circuits within each one of the signal supply circuits 400a and 400e. In this respect, the fifth preferred embodiment is superior to the conventional tree type system.

Figure 13:
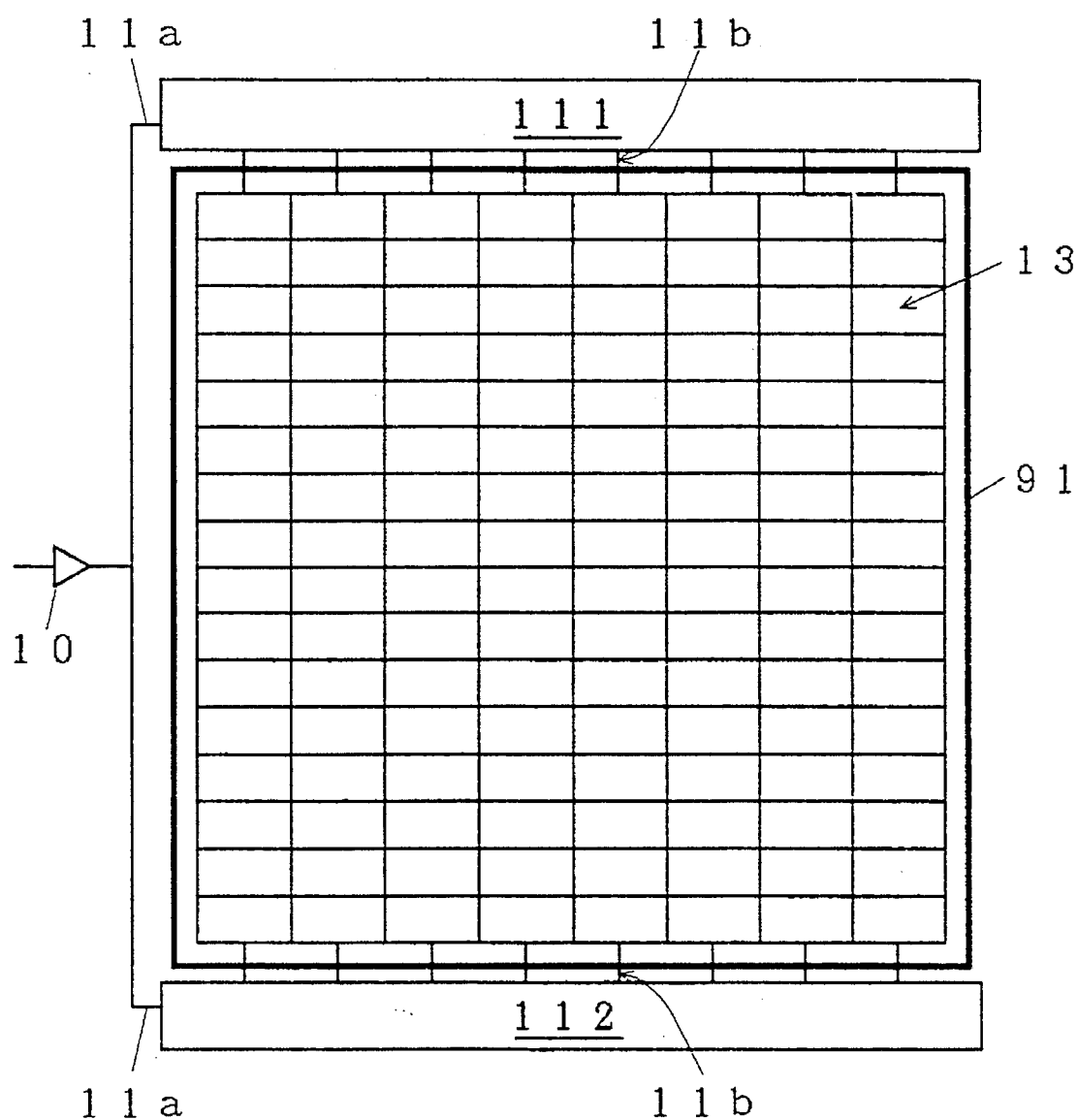
FIGS. 13 and 14 are block diagrams showing a sixth preferred embodiment of the present invention.

(B-6) Sixth Preferred Embodiment:

FIG. 13 is a block diagram showing a sixth preferred embodiment of the present invention. Input terminals 11a of both of signal supply circuits 111 and 112 are connected in common to an output terminal of a main driver 10. A distance from the output terminal of the main driver 10 to the input terminal 11a of the signal supply circuit 111 is the same as a distance from the output terminal of the main driver 10 to the input terminal 11a of the signal supply circuit 112.

Output terminals 11b of the signal supply circuit 111 are connected in the vicinity of a top-most edge of a signal supply wire 13 which has a mesh-like configuration while output terminals 11b of the signal supply circuit 112 are connected in the vicinity of a bottom-most edge of the signal supply wire 13. The signal supply wire 13 is spread over a logic area 91 in which logic circuits not shown are arranged at various positions. Through the signal supply wire 13, a signal is supplied to the logic circuits disposed within the logic area 91.

Figure 14:
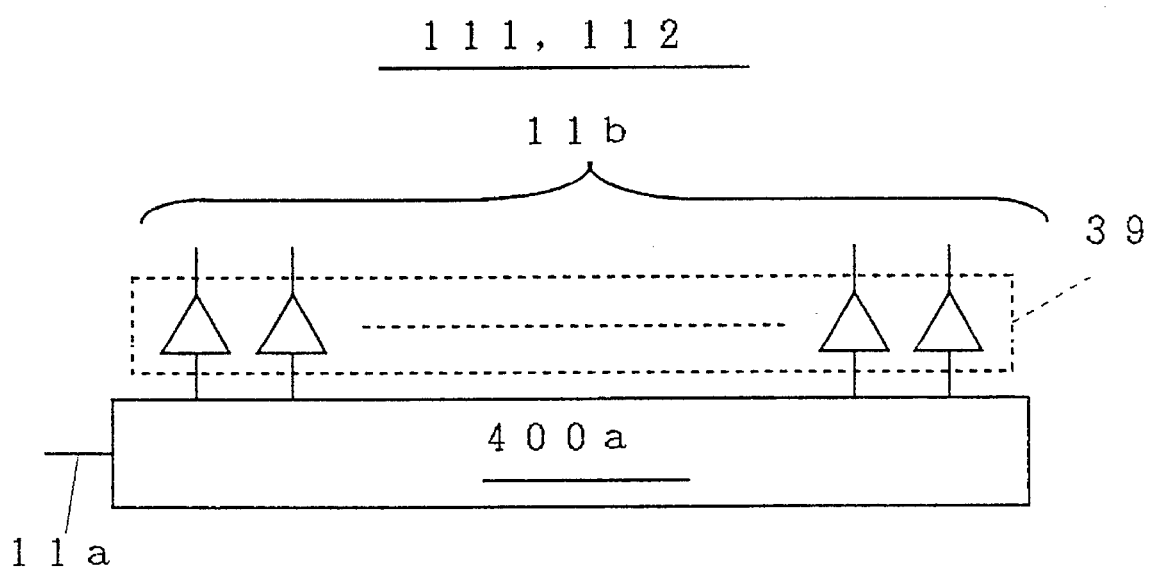

FIG. 14 is a block diagram showing a structure of the signal supply circuits 111 and 112. The signal supply circuits 111 and 112 are of the same structure, and comprises the signal supply circuit 400a of FIG. 1 and a driver group 39. The driver group 39 is similar in structure to the synchronizing circuit group 300a of FIG. 1 as it is modified so that the synchronizing circuits are replaced with drivers. Outputs of the signal supply circuit 400a are respectively coupled to input terminals of the drivers which form the driver group 39. Outputs from the drivers which form the driver group 39 are given to the output terminals 11b of the driver group 39.

Since an input signal supplied to the input terminal of the main driver 10 is transferred approximately the same distance to the signal supply circuits 111 and 112, the input terminals 11a of the signal supply circuits 111 and 112 receive the signal approximately at the same time. As shown in the first preferred embodiment, the signal supply circuit 400a transmits the input signal to the input terminals of the drivers which form the driver group 39 approximately at the same time. Hence, the input signal is received by the output terminals 11b of the signal supply circuits 111 and 112 almost at the same time.

In this manner, the input signal is transmitted to the top-most edge and the bottom-most edge of the signal supply wire 13 approximately at the same time, and therefore, a difference in the lengths of the wires among the logic circuits which are arranged at various positions within the logic area 91 is at most about half the distance between the top-most edge and the bottom-most edge of the signal supply wire 13. This enables a reduction in skews which have a dependence on the location of the logic circuits.

In addition, since a number of the drivers which drive the signal supply wire 13 (that is, the drivers which form the driver group 39) can be used, each driver only has to drive a divided small amount of the capacitance, allowing a reduction in the size of each driver and in a noise which is created within each driver. Further, wire portions near the output terminals of the drivers, i.e., the top-most edge and the bottom-most edge of the signal supply wire 13 can be formed thin since the amount of a current which is outputted by each driver is reduced small, and therefore, it is possible to reduce the capacitance of the signal supply wire 13.

Of course, the fifth preferred embodiment does not exclusively require that the signal supply circuits 111 and 112 are respectively disposed at the top-most edge and the bottom-most edge of the signal supply wire 13. A similar effect is attained even if the signal supply circuits 111 and 112 are respectively disposed at and connected to the right-hand side edge and the left-hand side edge of the signal supply wire 13.

Figure 15:
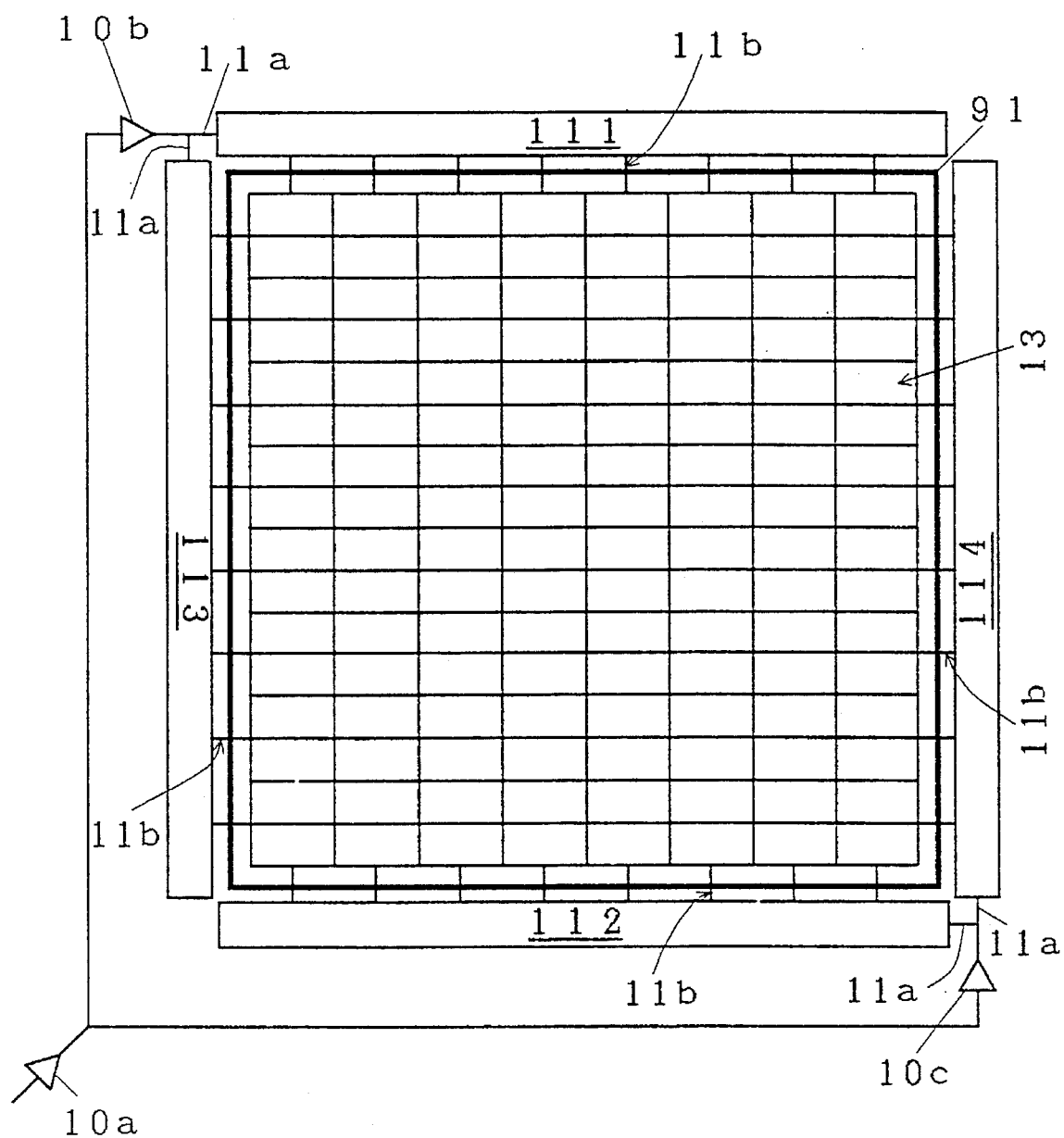
FIG. 15 is a block diagram showing a seventh preferred embodiment of the present invention.

(B-7) Seventh Preferred Embodiment:

FIG. 15 is a block diagram showing a seventh preferred embodiment of the present invention. Input terminals of sub drivers 10b and 10c are connected in common to an output terminal of a main driver 10a. The logic area 91 is nearly a square. Each side of the square-shaped logic area 91 is approximately equal to a distance between the output terminal of the main driver 10a and the input terminal of the sub driver 10b and as well as to a distance between the output terminal of the main driver 10a and the input terminal of the sub driver 10c. The sub drivers 10b and 10c are disposed in the vicinity of diagonal corners of the logic area 91. Similarly to the sixth preferred embodiment, the output terminals 11b of the signal supply circuits 111 and 112 are connected to the top-most edge and the bottom-most edge of the signal supply wire 13, respectively. A difference from the sixth preferred embodiment is that the input terminals 11a of the signal supply circuits 111 and 112 are respectively connected to the output terminals of the sub drivers 10b and 10c.

In the vicinity of the right-hand side edge and the left-hand side edge of the signal supply wire 13, signal supply circuits 113 and 114 are respectively disposed. The signal supply circuits 113 and 114 are each similar in structure to the signal supply circuits 111 and 112 except that the signal supply circuits 113 and 114 may include a difference number of the drivers from that of or the same number of the drivers as that of the signal supply circuits 111 and 112. Output terminals 11b of the signal supply circuit 113 are connected to the left-hand side edge of the signal supply wire 13 while output terminals 11b of the signal supply circuit 114 are connected to the right-hand side edge of the signal supply wire 13. An input terminal 11a of the signal supply circuit 113 is connected to the output terminal of the sub driver 10b, whereas an input terminal 11a of the signal supply circuit 114 is connected to the output terminal of the sub driver 10c.

In such a structure, an input signal received at the input terminal of the main driver 10a is transmitted to the input terminals of the sub drivers 10b and 10c approximately at the same time. It is also almost simultaneously that the signal is transmitted to the input terminals 11a of all of the signal supply circuits 111, 112, 113 and 114. Hence, similarly to the sixth preferred embodiment, the input signal is transmitted to the logic circuits (not shown) of the logic area 91 approximately at the same time.

In the seventh preferred embodiment, since a greater number of the drivers drive the signal supply wire 13 than in the sixth preferred embodiment, a further reduction in the size of each driver, a further reduction in a noise and a further reduction in the capacitance of the signal supply wire 13 are attained. In addition to this, since the signal supply wire 13 is driven from the surrounding four sides, paths for supplying the signal to the logic circuits which are arranged at various positions within the logic area 91 are easily ensured. This is particularly advantageous in such a case where mega cells each larger than one cell of the mesh-like structure of the signal supply wire 13 are to be arranged in the logic area 91. This is because the paths for supplying the signal to the logic circuits will not be destroyed even if a portion of the signal supply wire 13 is cut away to dispose the mega cells, and therefore, the freedom in designing the layout of mega cells is enhanced.

Figure 16:
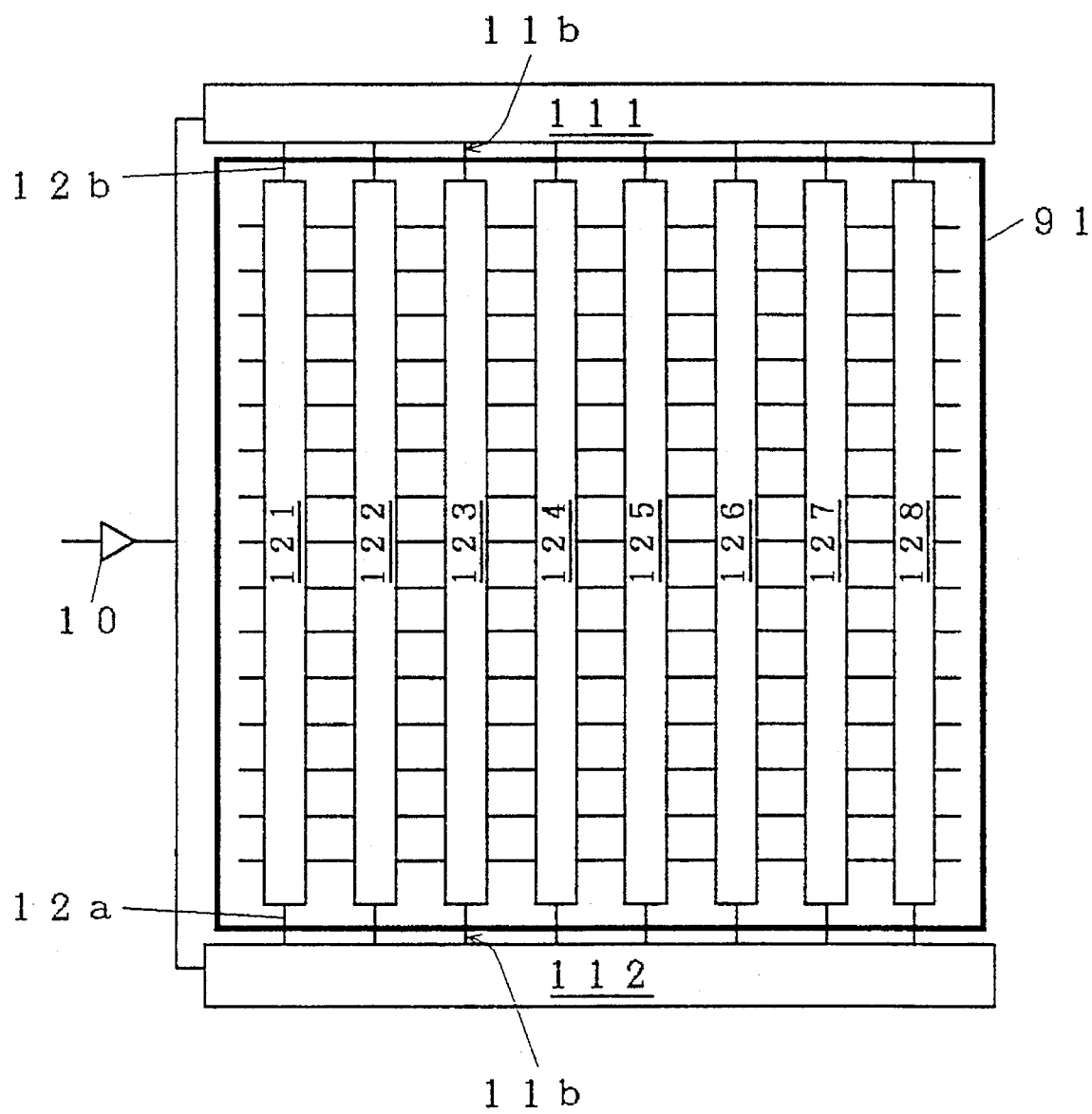
FIGS. 16 and 17 are block diagrams showing an eighth preferred embodiment of the present invention.
Figure 17:
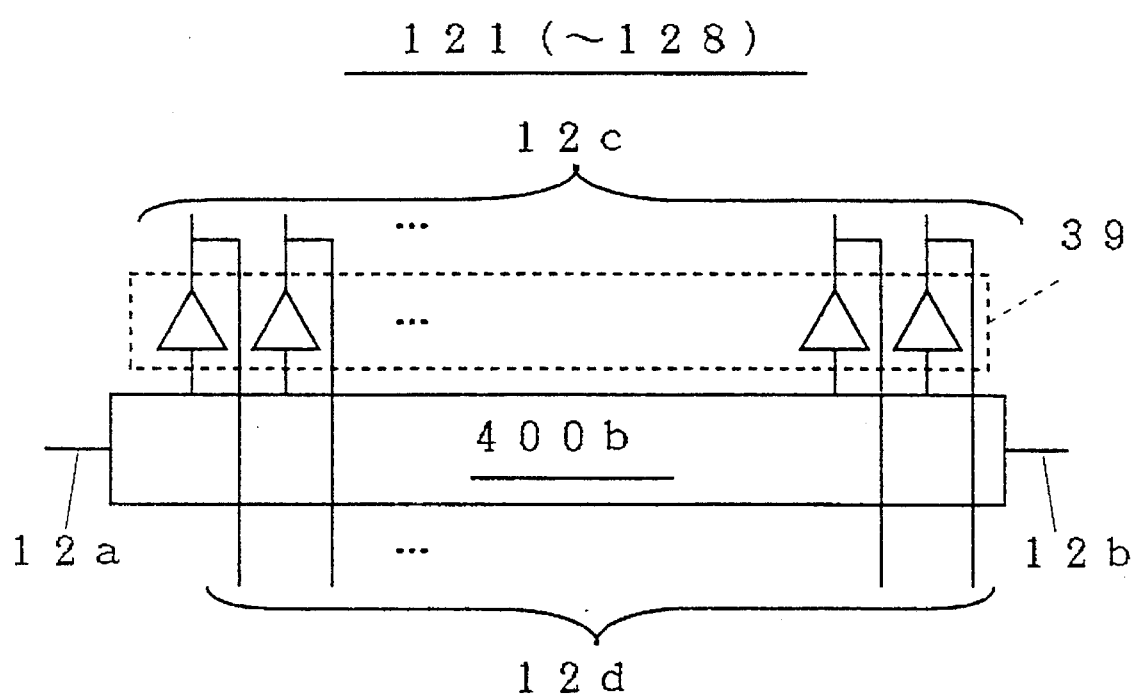

(B-8) Eighth Preferred Embodiment:

FIG. 16 is a block diagram showing an eighth preferred embodiment of the present invention. The eighth preferred embodiment is equivalent to the sixth preferred embodiment as it is modified so that the signal supply wire 13 are replaced with signal supply circuits 121 to 128. FIG. 17 is a block diagram showing a structure of the signal supply circuits 121 to 128. The signal supply circuits 121 to 128 include the signal supply circuit 400b of FIG. 7 and the driver group 39 of FIG. 14. The driver group 39 functions as the synchronizing circuits of the signal supply circuit 400b. The input terminals of the driver group 39 are respectively connected to the output terminals of the signal supply circuit 400b.

The output terminals of the driver group 39 are each connected to two output lines, one forming a first output terminal group 12c and the other forming a second output terminal group 12d in each one of the signal supply circuits 121 to 128. Of the signal supply circuits 121 to 128, the first output terminal group 12c of one of any adjacent two signal supply circuits and the second output terminal group 12d of the other one of the adjacent two signal supply circuits are connected in correspondence to each other. Input terminals 12a and 12b of the signal supply circuit 400b are connected to the input terminals of the driver circuits 1a and 1b of FIG. 7, respectively.

As in the sixth preferred embodiment, the output terminals 11b of the signal supply circuit 111 transmit the input signal to the input terminals 12b of the signal supply circuits 121 to 128 approximately at the same time. The output terminals 11b of the signal supply circuit 112 transmit the input signal to the input terminals 12a of the signal supply circuits 121 to 128 approximately at the same time, which is also the same as in the sixth preferred embodiment. The signal supply circuits 121 to 128, as can be understood from the second preferred embodiment, transmit the input signal to the driver group 39 almost simultaneously. Hence, similarly to the sixth preferred embodiment, the input signal is transmitted to the logic circuits (not shown) which are arranged at various positions within the logic area 91 approximately at the same time.

In the eighth preferred embodiment, since a greater number of the drivers drive the signal supply wire 13 than in the sixth preferred embodiment, a further reduction in the size of each driver and a further reduction in a noise are achieved. Further advantageously, the paths for supplying the signal to the logic circuits of the logic area 91 are very short because a plurality of the drivers are arranged within the logic area 91, thereby suppressing any skew among all of the logic circuits to an extremely small value.

It is needless to mention that the eighth preferred embodiment does not exclusively require that the signal supply circuits 111 and 112 are respectively disposed at the top-most edge and the bottom-most edge of the signal supply wire 13. A similar effect is attained even if the signal supply circuits 111 and 112 are respectively disposed at and connected to the right-hand side edge and the left-hand side edge of the signal supply wire 13 and the signal supply circuits 121 to 128 are connected to the signal supply circuits 111 and 112 which are arranged at such positions.

Figure 18:
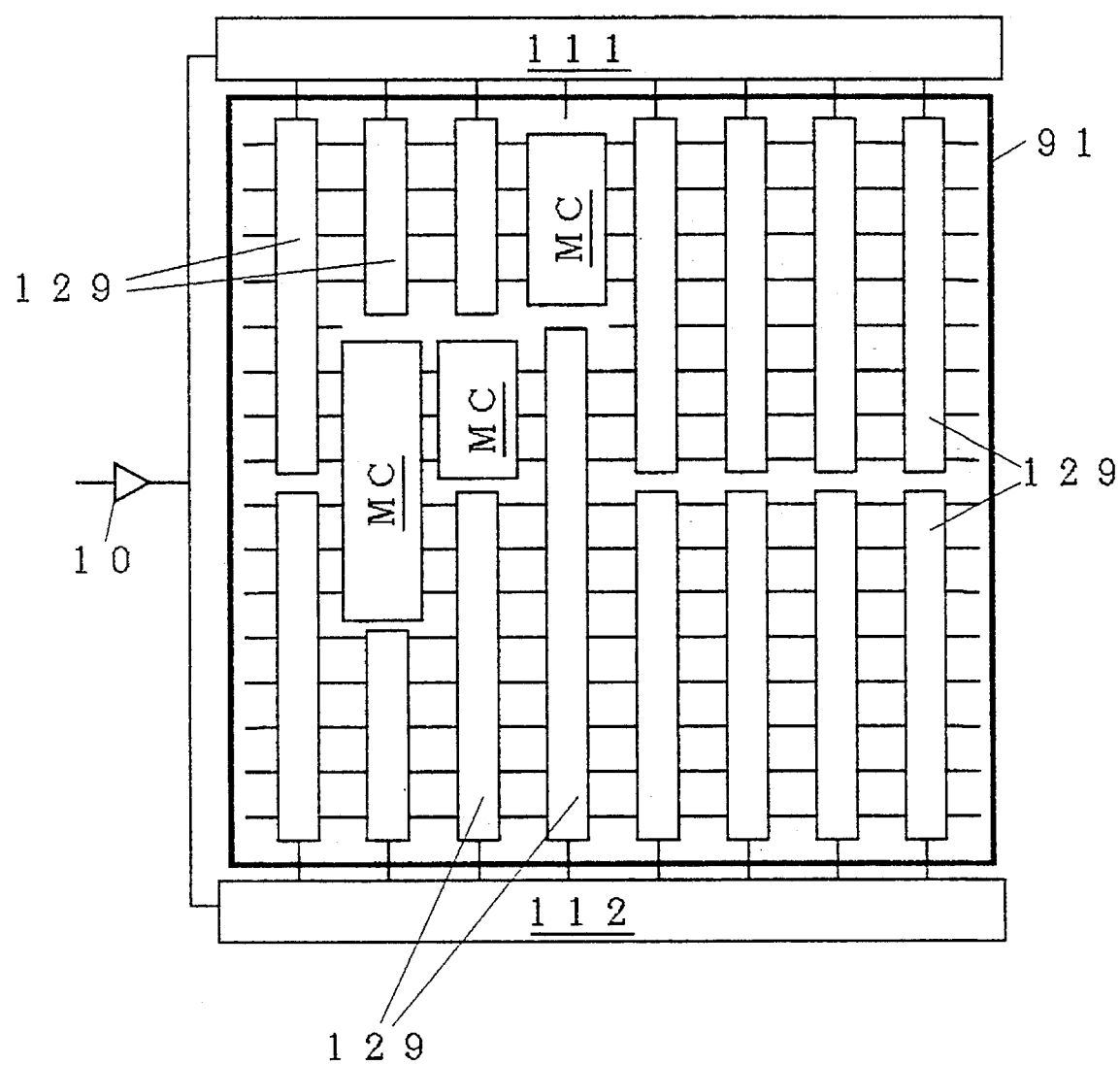
FIG. 18 is a block diagram showing a ninth preferred embodiment of the present invention.

(B-9) Ninth Preferred Embodiment:

FIG. 18 is a block diagram showing a ninth preferred embodiment of the present invention. The ninth preferred embodiment is equivalent to the eighth preferred embodiment as it is modified so that the signal supply circuits 121 to 128 are replaced with signal supply circuits 129.

Each signal supply circuit 129 is similar in structure to the signal supply circuits 121 to 128 except that its length needs not have a fixed value. For this reason, an effect similar to that of the eighth preferred embodiment is promised even if the logic area 91 includes such a logic circuit as a mega cell MC which is fabricated to have larger dimensions than the interval between the first output terminals 12c and the interval between the second output terminals 12d of the signal supply circuit 121. In other words, the ninth preferred embodiment is advantageous in that a large freedom is secured in designing the circuit structure in which the mega cell MC is to be included in the logic area 91.

Of the signal supply circuits 129, time delays among those which have different lengths can be adjusted to approximately the same amount by adjusting the sizes of the drivers which are disposed inside each signal supply circuit.

Figure 19:
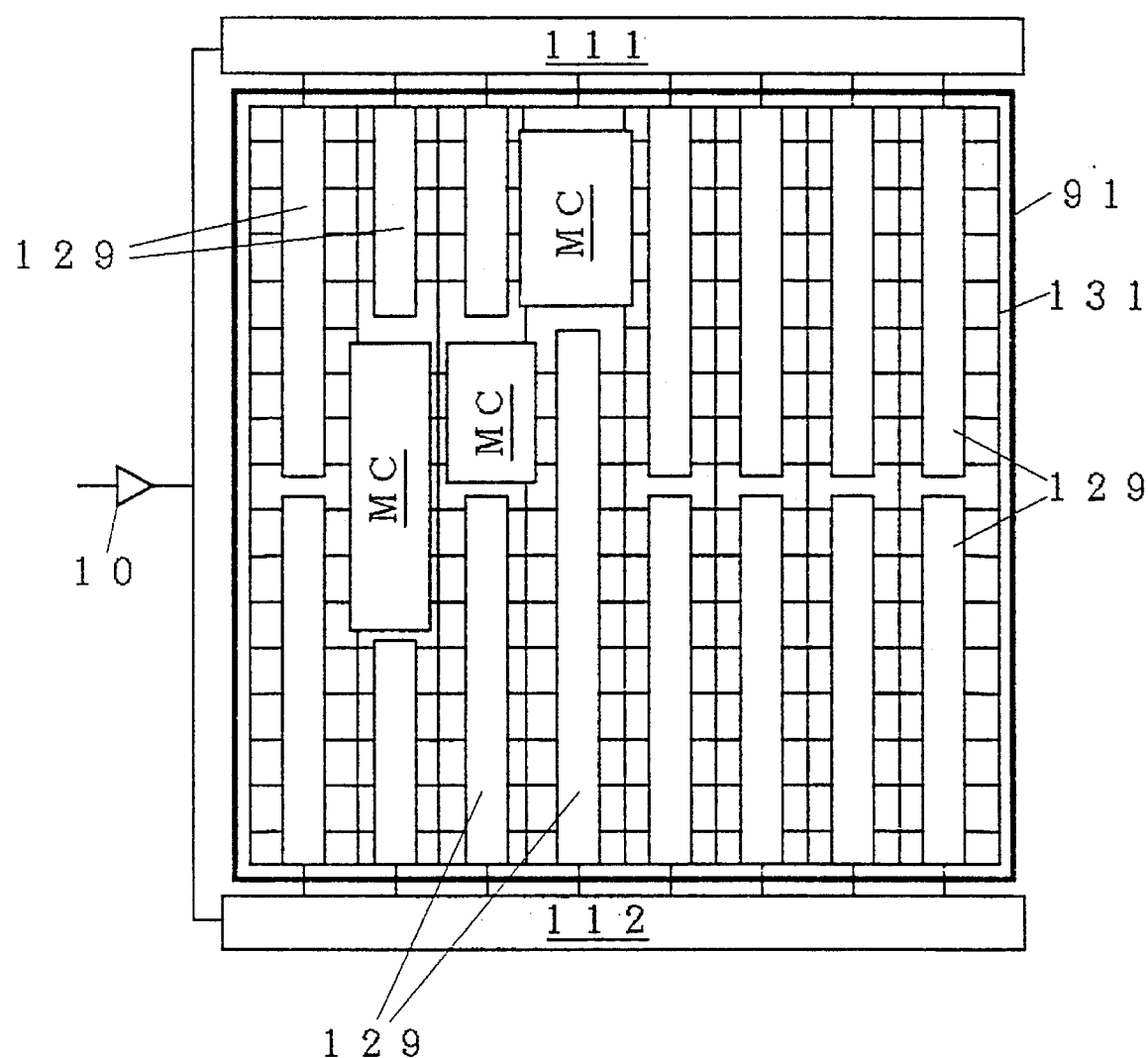
FIG. 19 is a block diagram showing a tenth preferred embodiment of the present invention.
Figure 20:
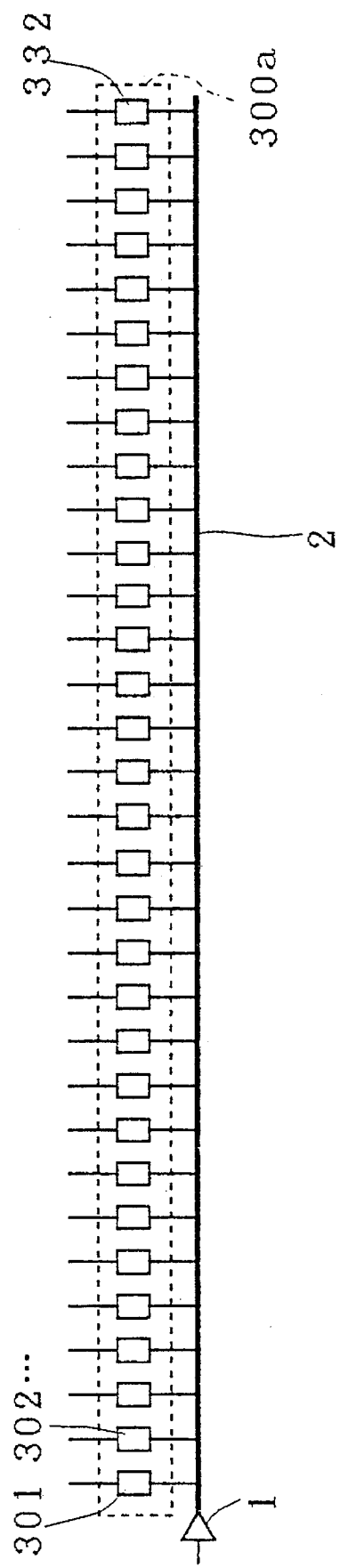
FIGS. 20 and 21 are circuitry diagrams showing a conventional technique.

(B-10) Tenth Preferred Embodiment:

FIG. 19 is a block diagram showing a tenth preferred embodiment of the present invention. The tenth preferred embodiment is equivalent to the ninth preferred embodiment as it is modified to further comprise an additional mesh-like configured signal supply wire 131. Internal wires of the mesh-like configured signal supply wire 131 are electrically connected to points overlapping the output terminals of the signal supply circuits 129. A top-most edge and the bottom-most edge of the signal supply wire 131 are connected to the output terminals of the signal supply circuits 111 and 112, respectively.

In such a structure, since even very small skews at the output terminals of the signal supply circuits 129 are reduced still smaller by the signal supply wire 131, it is possible to prevent the characteristics of the drivers from becoming different from each other and skews from increasing due to irregular intervals between the logic circuits.

While the invention has been described in detail, the foregoing description is in all aspects illustrative and not restrictive. It is understood that numerous other modifications and variations can be devised without departing from the scope of the invention.

We claim:

1. A signal supply circuit, comprising:

two first signal transmitting elements each including an output end and an input end which receives an input signal, and said input signal is supplied to said input end of any one of said two first signal transmitting elements;

a first wire including a first end and a second end, said first end being connected to said output end of one of said two first signal transmitting elements;

wherein said output end of the other of said two first signal transmitting elements is connected to said second end of said first wire, and a plurality of second signal transmitting elements each including an input end and an output end, said input ends of said second signal transmitting elements being connected to said first wire;

a second wire which is connected to said output ends of said second signal transmitting elements; and a plurality of output terminals which are connected to said second wire at different positions, wherein said input ends of said plurality of said second signal transmitting elements are connected to said first wire at different positions, and said output ends of said plurality of said second signal transmitting elements are connected to said second wire at said different positions.

2. A signal supply circuit, comprising:

a signal transmitting main element including an input end and an output end, an input signal being supplied to said input end;

a mesh-like wire; and at least one pair of signal supply means, each one of said signal supply means including:

an input terminal which is connected to said output end of said signal transmitting main element;

a plurality of output terminals;

a first signal transmitting element which includes an input end and an output end, said input end of said first signal transmitting element being connected to said input terminal;

a first wire which includes a first end and a second end, said first end being connected to said output end of said first signal transmitting element;

a plurality of second signal transmitting elements each including an input end and an output end, said input end of each of said second signal transmitting elements being connected to said first wire;

a second wire, said output ends of said plurality of said second signal transmitting elements being connected to said second wire at different positions; and a plurality of third signal transmitting elements which are disposed in correspondence to said plurality of said output terminals, said output terminals being connected to said second wire at different positions through said third signal transmitting elements, wherein said pair of signal supply means is disposed in such a manner that said signal supply means are located at opposite ends of said mesh-like wire, in each one of said signal supply means, said output terminals are connected to said mesh-like wire, and wherein said input ends of said plurality of said second signal transmitting elements are connected to said first wire at different positions, and wherein said input terminals of said signal supply means are connected to said output end of said signal transmitting main element at the same distance.

3. The signal supply circuit of claim 2, wherein there are two pairs of signal supply means disposed in such a manner that said signal supply means of each pair are located at opposite ends of said mesh-like wire, and wherein said input terminals of all of said signal supply means are connected to said output end of said signal transmitting main element at the same distance.

4. The signal supply circuit of claim 3, further comprising a pair of signal transmitting sub elements, each one of said signal transmitting sub elements including an input end and an output end, said input end of each one of said signal transmitting sub elements being connected to said output end of said signal transmitting main element, said input terminal of one of said signal supply means which forms one of said pairs of said signal supply means and said input terminal of one of said signal supply means which forms the other of said pairs of said signal supply means being connected in common to said output end of each one of said signal transmitting sub elements.

5. A signal supply circuit, comprising:

a signal transmitting main element including an input end and an output end, an input signal being supplied to said input end of said signal transmitting main element;

a plurality of first signal supply means which are arranged in one direction, each including:

a pair of input terminals;

pairs of output terminals;

a pair of first signal transmitting elements, said first signal transmitting elements each including an input end and an output end, said input end of one of said first signal transmitting elements being connected to each of said input terminals;

a first wire which includes a first end and a second end, said first end being connected to said output end of one of said first signal transmitting elements, said second end being connected to said output end of the other one of said first signal transmitting elements;

a plurality of second signal transmitting elements each including an input end and an output end, said input end of each of said second signal transmitting elements being connected to said first wire;

a second wire, said output ends of said plurality of said second signal transmitting elements being connected to said second wire at different positions; and a plurality of third signal transmitting elements which are disposed in correspondence to said pairs of said output terminals, said output terminals of each one of said pairs being connected to said second wire at different positions through said third signal transmitting elements, a pair of second signal supply means which is disposed in such a manner that said second signal supply means are located at opposite ends of an array of said first signal supply means, each including:

an input terminal which is connected to said output end of said signal transmitting main element;

a plurality of output terminals which are disposed in correspondence to said first signal supply means, said output terminals being respectively connected to said input terminals of said first signal supply means;

a fourth signal transmitting element which includes an input end and an output end, said input end of said fourth signal transmitting element being connected to said input terminal;

a third wire which includes a first end and a second end, said first end of said third wire being connected to said output end of said fourth signal transmitting element;

a plurality of fifth signal transmitting elements each including an input end and an output end, said input ends of said fifth signal transmitting elements being respectively connected to said third wire;

a fourth wire, said output ends of said plurality of said fifth signal transmitting elements being connected to said fourth wire at different positions; and sixth signal transmitting elements which are disposed in correspondence to said plurality of said output terminals, said output terminals being connected to said fourth wire at different positions through said sixth signal transmitting elements, wherein said input ends of said second signal transmitting elements being connected to said first wire at different positions through said sixth signal transmitting elements, wherein said input ends of said fifth signal transmitting elements being connected to said third wire at different positions through said fifth signal transmitting elements, and wherein said input terminals of all of said pair of said second signal supply means are connected to said output end of said signal transmitting main element at the same distance.

6. The signal supply circuit of claim 5, wherein the number of said output terminals of each one of said first signal supply means is the same.

7. The signal supply circuit of claim 5, further comprising a mesh-like wire which is disposed in a region which is sandwiched by said second signal supply means and in which said first signal supply means are arranged, said mesh-like wire including:

a side which is connected to said output terminals of said second signal supply means; and an internal wire which is connected to said output terminals of said first signal supply means.

8. A signal supply circuit comprising:

at least one first signal transmitting element each including an output end and an input end which receives an input signal;

a plurality of first wires each including a first end and a second end, each first end being connected to said output end of one of said at least one first signal transmitting element;

a plurality of second signal transmitting elements each including an input end and an output end, each of said input ends of said second signal transmitting elements being connected to the second end of one of said first wires;

a second wire which is connected to said output ends of said second signal transmitting elements;

a plurality of output terminals which are connected to said second wire at different positions; and a tree-like wire including an output end and an input end, said output end of said tree-like wire being connected to said second end of any one of said plurality of first wires, said input end of said tree-like wire being connected to said output end of said first signal transmitting element, wherein each of said input ends of said plurality of said second signal transmitting elements are connected to one of said first wires at different positions, and said output ends of said plurality of said second signal transmitting elements are connected to said second wire at said different positions.

9. The signal supply circuit according to claim 8, wherein said second wire is arranged parallel to said plurality of first wires.

10. The signal supply circuit according to claim 8, wherein each of said input ends of said plurality of said second signal transmitting elements are connected to one of said first wires at equal intervals along the first wires.

11. The signal supply circuit according to claim 9, wherein said output ends of said plurality of said second signal transmitting elements are connected to said second wire at equal intervals.

12. A signal supply circuit comprising:

at least one first signal transmitting element each including an output end and an input end which receives an input signal;

a first wire including a first end being connected to said output end of one of said at least one first signal transmitting element;

a plurality of second signal transmitting elements each including an input end and an output end, said input ends of said second signal transmitting elements being connected to said first wire;

a second wire which is connected to said output ends of said second signal transmitting elements;

a plurality of output terminals which are connected to said second wire at different positions; and a plurality of tree-like wires which are disposed in correspondence to said output terminals, each one of said tree-like wires including:

an input end which is connected to a relevant one of said output terminals; and a plurality of output ends for dividing and outputting a signal which is received at said input end of each one of said tree-like wires, wherein said input ends of said plurality of said second signal transmitting elements are connected to said first wire at different positions, and said output ends of said plurality of said second signal transmitting elements are connected to said second wire at said different positions.

13. The signal supply circuit according to claim 12, wherein said first and said second wires are arranged parallel to each other.

14. The signal supply circuit according to claim 12, wherein said input ends of said plurality of said second signal transmitting elements are connected to said first wire at equal intervals.

15. The signal supply circuit according to claim 14, wherein said output ends of said plurality of said second signal transmitting elements are connected to said second wire at equal intervals.

16. The signal supply circuit according to claim 12, wherein there are two first signal transmitting elements, a second end of said first wire is connected to an output end of one of said two first signal transmitting elements other than said one of said at least one first signal transmitting element which is connected to said first end of said first wire, and said input signal is supplied to said input end of any one of said two first signal transmitting elements.

17. A signal supply circuit comprising:

at least one first signal transmitting element each including an output end and an input end which receives an input signal;

a first wire including a first end being connected to said output end of one of said at least one first signal transmitting element;

a plurality of second signal transmitting elements each including an input end and an output end, said input ends of said second signal transmitting elements being connected to said first wire;

a second wire which is connected to said output ends of said second signal transmitting elements;

a plurality of output terminals which are connected to said second wire at different positions;

a plurality of third signal transmitting elements which are disposed in correspondence to said output terminals, each one of said plurality of said third signal transmitting elements including an input end and an output end, said input end of each one of said third signal transmitting elements being connected to each one of said output terminals;

a third wire, said output ends of said third signal transmitting elements being connected to said third wire at different positions; and a plurality of output lines which are connected to said third wire at different positions, wherein said input ends of said plurality of said second signal transmitting elements are connected to said first wire at different positions, and said output ends of said plurality of said second signal transmitting elements are connected to said second wire at said different positions.

18. The signal supply circuit according to claim 17, wherein said first and said second wires are arranged parallel to each other.

19. The signal supply circuit according to claim 17, wherein said input ends of said plurality of said second signal transmitting elements are connected to said first wire at equal intervals.

20. The signal supply circuit according to claim 19, wherein said output ends of said plurality of said second signal transmitting elements are connected to said second wire at equal intervals.

21. The signal supply circuit according to claim 17, wherein there are two first signal transmitting elements, a second end of said first wire is connected to an output end of one of said two first signal transmitting elements other than said one of said at least one first signal transmitting element which is connected to said first end of said first wire, and said input signal is supplied to said input end of any one of said two first signal transmitting elements.

\* \* \* \* \*